United States Patent
Lee et al.

(10) Patent No.: US 10,725,126 B2
(45) Date of Patent: Jul. 28, 2020

(54) BIOMOLECULE MAGNETIC SENSOR

(71) Applicant: Industrial Technology Research Institute, Hsinchu (TW)

(72) Inventors: Hsin-Han Lee, Taipei (TW); Yu-Sheng Chen, Taoyuan (TW); Ding-Yeong Wang, Hsinchu County (TW); Yu-Chen Hsin, Hsinchu County (TW)

(73) Assignee: Industrial Technology Research Institute, Hsinchu (TW)

( * ) Notice: Subject to any disclaimer, the term of this patent is extended or adjusted under 35 U.S.C. 154(b) by 187 days.

(21) Appl. No.: 15/394,836

(22) Filed: Dec. 30, 2016

(65) Prior Publication Data

US 2018/0067175 A1    Mar. 8, 2018

Related U.S. Application Data

(60) Provisional application No. 62/383,506, filed on Sep. 5, 2016.

(30) Foreign Application Priority Data

Dec. 6, 2016 (TW) .............................. 105140210 A

(51) Int. Cl.
*G01R 33/12* (2006.01)
*B03C 1/00* (2006.01)
*H01F 1/00* (2006.01)

(52) U.S. Cl.
CPC ............ *G01R 33/1269* (2013.01); *B03C 1/00* (2013.01); *H01F 1/00* (2013.01)

(58) Field of Classification Search
CPC .................................................. G01R 33/1269
(Continued)

(56) References Cited

U.S. PATENT DOCUMENTS

| 6,875,621 B2 * | 4/2005 | Tondra ................. G01N 27/745 204/400 |
| 7,048,890 B2 | 5/2006 | Coehoorn et al. |

(Continued)

FOREIGN PATENT DOCUMENTS

| BR | PI0814380 | 1/2015 |
| BR | PI0814088 | 2/2015 |

(Continued)

OTHER PUBLICATIONS

Reig, C. et al. (2009). "Magnetic Field Sensors Based on Giant Magnetoresistance (GMR) Technology: Applications in Electrical Current Sensing." 9, 7919-7942. (Year: 2009).*

(Continued)

*Primary Examiner* — Jill A Warden
*Assistant Examiner* — Jacqueline Brazin
(74) *Attorney, Agent, or Firm* — JCIPRNET

(57) ABSTRACT

A biomolecule magnetic sensor configured to sense magnetic beads attached with biomolecules includes an adsorption pad, a magnetic field line generator and at least one magnetic sensor. The adsorption pad is configured to adsorb the magnetic beads. The magnetic field line generator is configured to generate a plurality of first magnetic field lines, and at least one of the first magnetic field lines passes through the magnetic beads along a first direction to induce a plurality of second magnetic field lines, wherein the magnetic field line generator is disposed between the adsorption pad and the magnetic sensor in the first direction. The magnetic sensor is configured to sense a magnetic field component of at least one of the second magnetic field lines in a second direction. A second shift is provided between the magnetic sensor and the adsorption pad in the second direction.

20 Claims, 16 Drawing Sheets

(58) Field of Classification Search
USPC .................................................... 422/68.1
See application file for complete search history.

(56) References Cited

U.S. PATENT DOCUMENTS

| | | | |
|---|---|---|---|
| 7,106,051 B2 | 9/2006 | Prins et al. | |
| 7,147,108 B2 | 12/2006 | Nickel | |
| 7,863,022 B2 | 1/2011 | Prins et al. | |
| 8,190,372 B2 | 5/2012 | Kahlman et al. | |
| 8,283,183 B2 | 10/2012 | Ikeda et al. | |
| 8,283,912 B2 | 10/2012 | Nieuwenhuis et al. | |
| 8,614,572 B2 | 12/2013 | Florescu et al. | |
| 8,828,740 B2 | 9/2014 | Kahlman et al. | |
| 8,852,957 B2 | 10/2014 | Ikeda | |
| 8,945,946 B2 | 2/2015 | Ikeda | |
| 9,103,824 B2 | 8/2015 | Ovsyanko | |
| 9,128,084 B2 | 9/2015 | Prins et al. | |
| 9,207,210 B2 | 12/2015 | Ovsyanko | |
| 2002/0166800 A1 | 11/2002 | Prentiss et al. | |
| 2004/0086918 A1 | 5/2004 | Loewy et al. | |
| 2005/0087000 A1 | 4/2005 | Coehoorn et al. | |
| 2005/0244987 A1 | 11/2005 | Utsunomiya et al. | |
| 2006/0263897 A1 | 11/2006 | Stapert et al. | |
| 2007/0298510 A1 | 12/2007 | Imamura et al. | |
| 2008/0024118 A1 | 1/2008 | Kahlman et al. | |
| 2008/0054896 A1* | 3/2008 | Kahlman | G01R 33/06 324/252 |
| 2008/0206104 A1 | 8/2008 | Prins et al. | |
| 2008/0206892 A1 | 8/2008 | Prins | |
| 2008/0218165 A1 | 9/2008 | Kahlman et al. | |
| 2008/0247908 A1 | 10/2008 | Kahlman | |
| 2008/0278156 A1 | 11/2008 | De Boer et al. | |
| 2008/0311598 A1 | 12/2008 | Vossenaar et al. | |
| 2009/0025810 A1* | 1/2009 | Wo | B01F 11/0258 137/808 |
| 2009/0184706 A1 | 7/2009 | Duric et al. | |
| 2009/0186420 A1 | 7/2009 | Kahlman et al. | |
| 2009/0219012 A1 | 9/2009 | Nieuwenhuis et al. | |
| 2009/0243594 A1 | 10/2009 | Kahlman | |
| 2009/0251136 A1* | 10/2009 | Prins | B82Y 25/00 324/228 |
| 2009/0278534 A1 | 11/2009 | Kahlman | |
| 2009/0309588 A1 | 12/2009 | Nieuwenhuis et al. | |
| 2009/0314066 A1 | 12/2009 | Nieuwenhuis et al. | |
| 2010/0060275 A1 | 3/2010 | Veen et al. | |
| 2010/0136669 A1 | 6/2010 | Weekamp et al. | |
| 2010/0176807 A1 | 7/2010 | Duric et al. | |
| 2010/0194386 A1 | 8/2010 | Prins et al. | |
| 2010/0277160 A1 | 11/2010 | De Theije et al. | |
| 2011/0018532 A1 | 1/2011 | Florescu et al. | |
| 2015/0044778 A1 | 2/2015 | Wang et al. | |
| 2015/0104784 A1 | 4/2015 | Dittmer et al. | |
| 2015/0323523 A1 | 11/2015 | Evers et al. | |
| 2018/0126374 A1* | 5/2018 | Ali | B01L 3/5023 |

FOREIGN PATENT DOCUMENTS

| | | |
|---|---|---|
| CN | 1829922 | 9/2006 |
| CN | 100343670 | 10/2007 |
| CN | 101283263 | 10/2008 |
| CN | 101292147 | 10/2008 |
| CN | 101427157 | 5/2009 |
| CN | 101523214 | 9/2009 |
| CN | 101627297 | 1/2010 |
| CN | 101802614 | 8/2010 |
| CN | 101925817 | 12/2010 |
| CN | 102439448 | 5/2012 |
| CN | 103260513 | 8/2013 |
| EP | 1957979 | 8/2008 |
| EP | 2038670 | 3/2009 |
| EP | 2380026 | 10/2011 |
| EP | 2583101 | 4/2013 |
| EP | 2700968 | 2/2014 |
| JP | 2009020097 | 1/2009 |
| JP | 2009025033 | 2/2009 |
| JP | 2009025193 | 2/2009 |
| JP | 2009031303 | 2/2009 |
| JP | 2009128169 | 6/2009 |
| JP | 2010002397 | 1/2010 |
| KR | 101135419 | 4/2012 |
| SG | 128943 | 2/2007 |
| TW | 200811440 | 3/2008 |
| TW | I295323 | 4/2008 |
| WO | 2007060568 | 5/2007 |
| WO | 2007132374 | 11/2007 |
| WO | 2008107847 | 9/2008 |
| WO | 2009024922 | 2/2009 |
| WO | 2009047714 | 4/2009 |
| WO | 2009069009 | 6/2009 |
| WO | 2009083856 | 7/2009 |
| WO | 2009150583 | 12/2009 |
| WO | 2011053435 | 5/2011 |
| WO | 2014160844 | 10/2014 |

OTHER PUBLICATIONS

David R. Baselt et al., "A biosensor based on magnetoresistance technology", Biosensors & Bioelectronics 13 (7-8), Oct. 1998, pp. 731-739.

Weifeng Shen et al., "In situ detection of single micron-sized magnetic beads using magnetic tunnel junction sensors", Applied Physics Letters 86(25), Jun. 2005, pp. 253901-1-pp. 253901-3.

P P Freitas et al., "Magnetoresistive sensors", Journal of Physics: Condensed Matter 19, Apr. 2007, pp. 1-21.

L. Ejsing et al., "Planar Hall effect sensor for magnetic micro- and nanobead detection", Applied Physics Letters 84 (23), Jun. 7, 2004, pp. 4729-4731.

R. C. Chaves et al., "Single molecule actuation and detection on a lab-on-a-chip magnetoresistive platform", Journal of Applied Physics 109(6), Mar. 2011, pp. 064702-1-064702-8.

"Office Action of Taiwan Counterpart Application," dated Jul. 24, 2017, p. 1-p. 4, in which the listed references (Ref.1-3) were cited.

"Search Report of European Counterpart Application," dated Aug. 7, 2017, p. 1-p. 13, in which the listed references (Ref.4-5) were cited.

* cited by examiner

BIOMOLECULE MAGNETIC SENSOR

CROSS-REFERENCE TO RELATED APPLICATION

This application claims the priority benefits of U.S. provisional application Ser. No. 62/383,506, filed on Sep. 5, 2016 and Taiwan application serial no. 105140210, filed on Dec. 6, 2016. The entirety of each of the above-mentioned patent applications is hereby incorporated by reference herein and made a part of this specification.

TECHNICAL FIELD

The disclosure relates to a biosensor, and relates to a biomolecule magnetic sensor.

BACKGROUND

In recent years, with advancements in nanotechnology, many innovative biosensors have been developed to effectively and rapidly detect biomolecules. Among them, research and application of magnetic nanoparticles in the field of biomedical science utilizing characteristics of the magnetic nanoparticles and mechanism of their interactions with biomolecules, magnetic sensors for sensing biomolecules, in particular, have also been gradually popularized.

A nanoparticle analysis is a common sensing method used to indirectly measure amount or concentration of a to-be-measured object by attaching magnetic beads with a to-be-measured biomolecule, applying an external magnetic field within a specific range, generating an additional magnetic field using a superparamagnetism of the magnetic beads, and measuring the additional magnetic field generated by the magnetic beads using the magnetic sensor.

In other words, magnetic sensing elements in the magnetic sensor is able to sense a magnetic field variation of the magnetic beads in order to estimate a density of the molecule attached on the magnetic beads. Given that the magnetic beads can only induce magnetic moment in an environment with the external magnetic field in order to generate the additional magnetic field, a magnetic force generator can be used to apply the external magnetic field to the magnetic beads. Because the magnetic sensing elements are also responsive to the external magnetic field generated by the magnetic force generator, finding a way to prevent magnetic sensing elements from influences caused by the external magnetic field generated by the magnetic force generator has become one of major issues to be addressed.

SUMMARY

A biomolecule magnetic sensor according to an embodiment of the disclosure is configured to sense magnetic beads attached with at least one to-be-measured biomolecule. The biomolecule magnetic sensor includes an adsorption pad, a magnetic field line generator and at least one magnetic sensor. The adsorption pad is configured to adsorb the magnetic beads. The magnetic field line generator is configured to generate a plurality of first magnetic field lines, and at least one of the first magnetic field lines passes through the magnetic beads along a first direction making the magnetic beads respond to the at least one of the magnetic field lines so as to induce a plurality of second magnetic field lines. The magnetic field line generator is disposed between the adsorption pad and the magnetic sensor in the first direction. A first shift and a second shift are provided between the magnetic sensor and the adsorption pad in different directions. The magnetic sensor is disposed on at least one of the second magnetic field lines, and configured to sense a magnetic field component of the at least one of the second magnetic field lines in a second direction. The first direction is different from the second direction, and a second shift is provided between the magnetic sensor and the adsorption pad in the second direction.

Several exemplary embodiments accompanied with figures are described in detail below to further describe the disclosure in details.

BRIEF DESCRIPTION OF THE DRAWINGS

The accompanying drawings are included to provide a further understanding of the disclosure, and are incorporated in and constitute a part of this specification. The drawings illustrate exemplary embodiments and, together with the description, serve to explain the principles of the disclosure.

DETAILED DESCRIPTION

Figure 1:
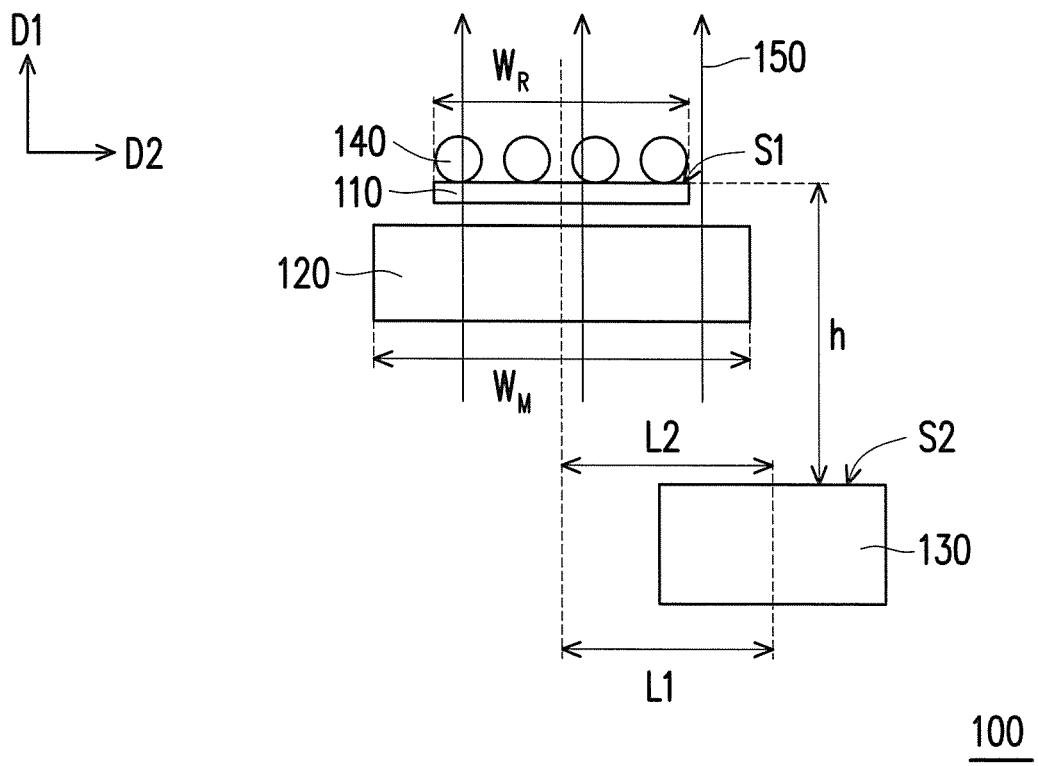
FIG. 1 is a schematic diagram illustrating a biomolecule magnetic sensor in an embodiment of the disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Figure 2:
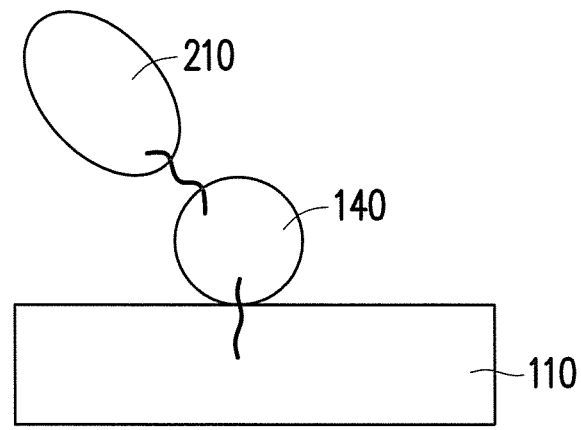
FIG. 2 is a schematic diagram illustrating an absorption mechanism of magnetic beads attached with a to-be-measured biomolecule.
Figure 3:
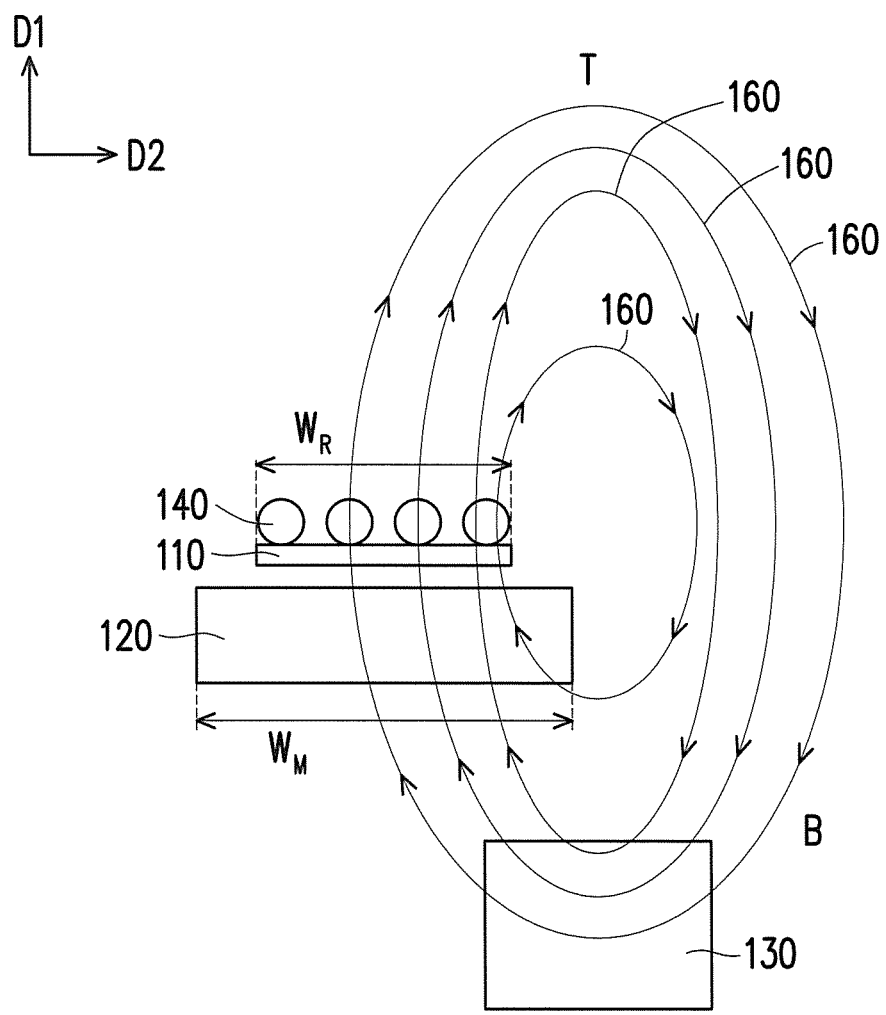
FIG. 3 is a schematic diagram illustrating distribution of a second magnetic field line in the biomolecule magnetic sensor in FIG. 1.

FIG. 1 is a schematic diagram illustrating a biomolecule magnetic sensor in an embodiment of the disclosure. FIG. 2 is a schematic diagram illustrating an absorption mechanism of magnetic beads attached with a to-be-measured biomolecule. FIG. 3 is a schematic diagram illustrating distribution of a second magnetic field line in the biomolecule magnetic sensor in FIG. 1. Referring to FIG. 1 to FIG. 3, a biomolecule magnetic sensor 100 of the present embodiment is configured to sense magnetic beads 140 attached with at least one to-be-measured biomolecule. The biomolecule magnetic sensor 100 of the present embodiment includes an adsorption pad 110, a magnetic field line generator 120 and a magnetic sensor 130, and is configured to detect density, amount or concentration of the magnetic beads 140. The adsorption pad 110 is configured to adsorb the magnetic beads 140. The number of magnetic beads adsorbed on the adsorption pad 110 may be one or more, depending on density, amount or concentration of the biomolecules, which is not particularly limited by the disclosure. In the present embodiment, multiple magnetic beads are adsorbed on the adsorption pad 110 as illustrated in FIG. 1, for example.

FIG. 2 is a schematic diagram briefly illustrating the magnetic beads adsorbed on the adsorption pad after being attached with the biomolecules. Biomolecules 210 may be, for example, nucleic acids, nucleotides, proteins or the like, which is not particularly limited by the disclosure. The biomolecules 210 are bonded onto the magnetic bead 140 before the magnetic bead 140 is absorbed onto the adsorption pad 110.

For instance, the biomolecules 210 can be attached onto the magnetic bead 140 by functional group bonding, and the magnetic bead 140 can generate silane bond with the adsorption pad 110 to be absorbed thereon. In addition, said technical means for attaching the biomolecules 210 with the magnetic bead 140 and said technical means for absorbing the magnetic bead 140 onto the adsorption pad 110 may be any conventional bonding method in the field or other bonding means, which are not particularly limited by the disclosure. Enough teaching, suggestion, and implementation illustration for detailed implementation of the above may be obtained with reference to common knowledge in the related art, which is not repeated hereinafter.

Referring to FIG. 1 and FIG. 3, in the present embodiment, the adsorption pad 110 is disposed directly above the magnetic field line generator 120 (e.g., a central axis of the adsorption pad 110 overlaps with a central axis of the magnetic field line generator 120 in a vertical stacking direction). That is to say, a shift between the adsorption pad 110 and the magnetic field line generator 120 is zero in a horizontal direction. The adsorption pad 110 has a width $W_R$ and a surface S1 facing away from the magnetic field line generator 120 is absorbed with multiple magnetic beads 140 already attached with the biomolecules. The magnetic field line generator 120 having a width $W_M$ is disposed on another side of the adsorption pad 110 opposite to the magnetic beads 140. The width $W_R$ of the adsorption pad 110 is less than the width $W_M$ of the magnetic field line generator 120. In an embodiment, the width $W_R$ of the adsorption pad 110 may be greater than 0.1 μm and less than 10 μm, and the width $W_M$ of the magnetic field line generator 120 may be greater than $W_R$ and less than 10 μm.

Next, the magnetic field line generator 120 applies a magnetic field to the magnetic beads 140 so the magnetic beads 140 can be driven to generate an additional magnetic field using a superparamagnetism of the magnetic beads.

In this embodiment, the magnetic field line generator 120 spontaneously generates, for example, a plurality of first magnetic field lines 150 to be applied to the magnetic beads 140. At least one of the first magnetic field lines 150 can pass through the magnetic beads 140 along a first direction D1, such as a direction perpendicular to the surface S1 of the adsorption pad 110 (hereinafter, also known as a vertical direction), making the magnetic beads 140 respond to the at least one of the first magnetic field lines 150 so as to induce a plurality of second magnetic field lines 160.

In the present embodiment, the magnetic field line generator 120 spontaneously generating the first magnetic field lines 150 means that the magnetic field line generator 120 includes a magnetic moment of its own, and is therefore able to generate the first magnetic field lines 150 to be applied to the magnetic beads 140 by utilizing characteristic of a closed loop formed by exposed magnetic field lines of ferromagnetic material without current provided from the outside. For instance, the magnetic field line generator 120 may be a magnetic thin-film layer. In the present embodiment, the magnetic thin-film layer has a magnetic moment perpendicular to a film surface of the magnetic thin-film layer, and can spontaneously generate the first magnetic field lines 150 in the vertical direction so the first direction D1 of the first magnetic field lines passing through the magnetic beads 140 is the vertical direction. In the present embodiment, the magnetic moment direction is upward or downward, which are not particularly limited by the disclosure.

In addition, material and structure of the magnetic field line generator 120 are not particularly limited by the disclosure. For example, a structure of the magnetic thin-film layer of the magnetic field line generator 120 may be a single-layer structure or a composite structure. Also, a ferromagnetic material of the single-layer structure includes Fe, Co, Ni, Gd, Tb, Dy, a FePt alloy, a CoFeB alloy, a CoFe alloy, a NiFe alloy or a FeB alloy. The composite structure includes a Fe—Pt composite layer, a Fe—Ni composite layer, a Fe—Pd composite layer, a Co—Pt composite layer, a Co—Ni composite layer or a Co—Pd composite layer. The above-mentioned Fe, Co, Ni, Gd, Tb, etc. are chemical element symbols.

Referring to FIG. 3, the second magnetic field line 160 shows an annular distribution near the adsorption pad 110, dividing two ends of the second magnetic field line 160 into a top portion T and a bottom portion B opposite to each other. With the surface S1 as a reference point, the second magnetic field lines 160 start from the surface S1 in a direction facing away from the magnetic field line generator 120; multiple second magnetic field lines 160 reached the top portion start to bend and significantly change the direction to extend along a reverse direction; the second magnetic field lines 160 reached the bottom portion B start to bend densely again, significantly change the direction of the magnetic field line again, and return back to the surface S1 to complete a closed magnetic field line annular distribution.

Next, the magnetic sensor 130 can estimate density, amount or concentration of the biomolecules 210 attached on the magnetic beads 140 by sensing a magnetic field variation of the second magnetic field lines 160 generated by the magnetic beads 140 and outputting a corresponding signal.

Referring back to FIG. 1, the magnetic sensor 130 is disposed below the adsorption pad 110, and the magnetic field line generator 120 is disposed between the adsorption pad 110 and the magnetic sensor 130 in the first direction D1. A first shift h is provided between a surface S2 of the magnetic sensor 130 close to the adsorption pad 110 and the surface S1 of the adsorption pad 110 in the first direction D1. Further, along a second direction D2 perpendicular to the first direction D1 (which is the horizontal direction in this embodiment), a second shift L1 is provided between the magnetic sensor 130 and the adsorption pad 110 and a third shift L2 is provided between the magnetic field line generator 120 and the magnetic sensor 130. For example, the second shift L1 is provided between a central axis of the magnetic sensor 130 and the central axis of the adsorption pad 110 in the second direction D2, and the third shift L2 is provided between central axis of the magnetic field line generator 120 and the central axis of the magnetic sensor 130. Based on the above, the adsorption pad 110 is disposed directly above the magnetic field line generator 120. Therefore, in the present embodiment, in the second direction D2 (i.e., the horizontal direction), the second shift L1 between the magnetic sensor 130 and the adsorption pad 110 is equal to the third shift L2 between the magnetic sensor 130 and the magnetic field line generator 120. The central axis of each of the magnetic sensor 130, the adsorption pad 110 and the magnetic field line generator 120 is defined in the direction D1.

Unlike the conventional technique, the magnetic sensor 130 is not disposed on the same vertical line or the same horizontal plane with the magnetic field line generator or the adsorption pad, but includes shifts with the adsorption pad 110 in the first direction D1 and the second direction D2 (which respectively are the vertical and horizontal directions in this embodiment), where the first direction D1 is different from the second direction D2.

The magnetic sensor 130 is, for example, a device capable of sensing magnetic field, including a giant magneto resistance (GMR) sensor, a tunneling magneto resistance (TMR) sensor, an anisotropic magneto resistance (AMR) sensor or a Hall sensor, which is not particular limited by the resent disclosure.

In the present embodiment, the magnetic sensor 130 is disposed on at least one of the second magnetic field lines 160, and configured to sense a magnetic field component of the at least one of the second magnetic field 160 lines in the second direction D2. For example, the magnetic sensor 130 is responsive to the magnetic field in the horizontal direction. The magnetic sensor 130 is disposed on the bottom portion B of the second magnetic field line 160 according to the structure in the present embodiment. Whether the magnetic sensor 130 is on the bottom portion or the top portion of the second magnetic field line 160 or on other position of the second magnetic field line 160 is not particularly limited by the disclosure as along as it is disposed on the second magnetic field line 160 with inclusion of the magnetic field component in the second direction D2. With structural configuration of the present embodiment, the magnetic sensor 130 can detect the magnetic field component of the additional magnetic field in the horizontal direction generated by the magnetic beads 140 driven by the magnetic field line generator 120. And yet, the first magnetic field lines 150 generated by the magnetic field line generator 120 are not significant enough to intervene a detecting result of the magnetic sensor 130. In an embodiment, between the magnetic sensor 130 and the adsorption pad 110, the first shift h in the first direction D1 may be 0.1 µm to 2 µm and the second shift L1 in the second direction D2 may be 0.1 µm to 10 µm, so the magnetic sensor 130 is able to detect the magnetic field component of the second magnetic field line in the second direction D2.

A shape of the adsorption pad in the present embodiment may be a circle, a rectangle or any other shape, which is not particularly limited by the disclosure. Shapes and amounts of the magnetic beads 140, the adsorption pad 110, the magnetic field line generator 120, the magnetic sensor 130, the first and second magnetic field lines 150 and 160 are descriptive examples instead of limitations to the disclosure.

In view of the biomolecule magnetic sensor 100 in the present embodiment, at least one of the first magnetic field lines 150 generated by the magnetic field line generator 120 passes through the magnetic beads 140 along the first direction D1; the first shift h in the first direction D1 and the second shift L1 in the second direction D2 are provided between the magnetic sensor 130 and the adsorption pad 110; the magnetic sensor 130 is disposed on the at least one of the second magnetic field lines 160, and configured to sense the magnetic field component of the at least one of the second magnetic field lines 160 in the second direction D2, where the first direction D1 is different from the second direction D2. Accordingly, influences caused by the magnetic field generated by the magnetic field line generator 120 on the magnetic sensor 130 can be reduced so the structure of the biomolecule magnetic sensor 100 can be simplified. As a result, aside from the improved convenience in the manufacturing process, the advantage of small volume in terms of future device design and usage may also be taken into consideration.

Figure 4:
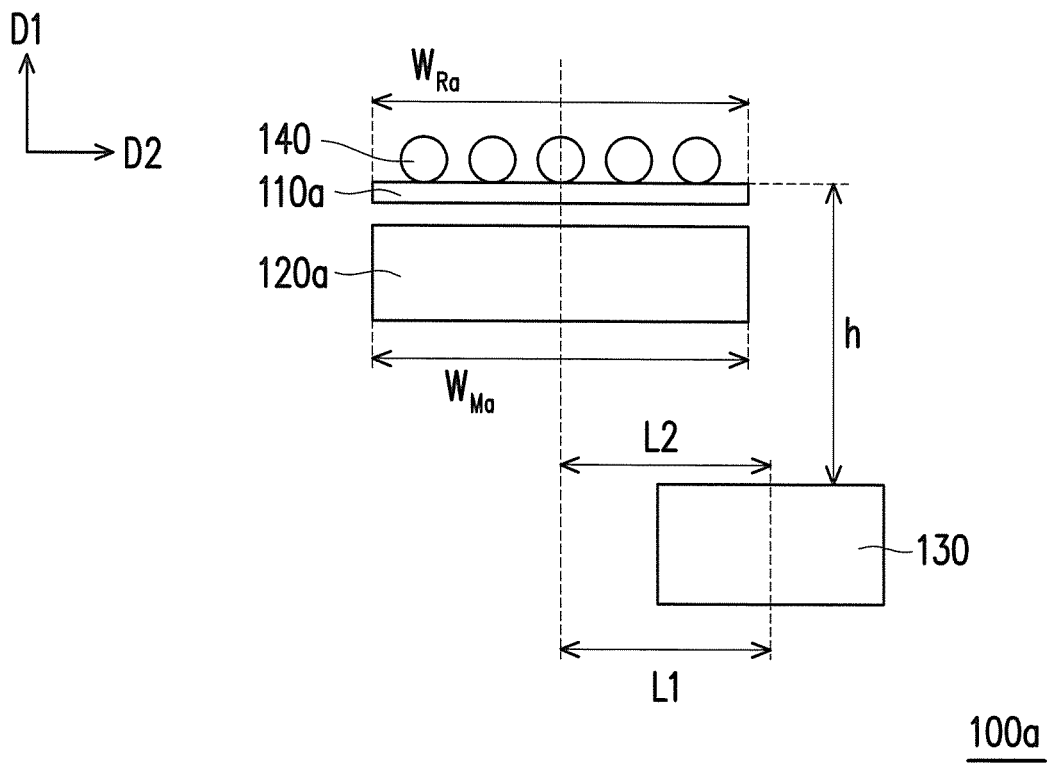
FIG. 4 is a schematic diagram illustrating a biomolecule magnetic sensor in an embodiment of the disclosure.

FIG. 4 is a schematic diagram illustrating a biomolecule magnetic sensor in an embodiment of the disclosure. A biomolecule magnetic sensor 100a has a basic structure similar to that of the embodiment in FIG. 1 with the following difference. In this embodiment, a width $W_{Ra}$ of an adsorption pad 110a is equal to a width $W_{Ma}$ of a magnetic field line generator 120a. In an embodiment, the width $W_{Ra}$ of the adsorption pad 110a may be 0.1 µm to 10 µm. Enough teaching, suggestion, and implementation illustration regarding structure, detection principle and implementation of this embodiment may be obtained from the foregoing embodiments depicted in FIG. 1 to FIG. 3, and thus related description thereof are not repeated hereinafter.

Figure 5:
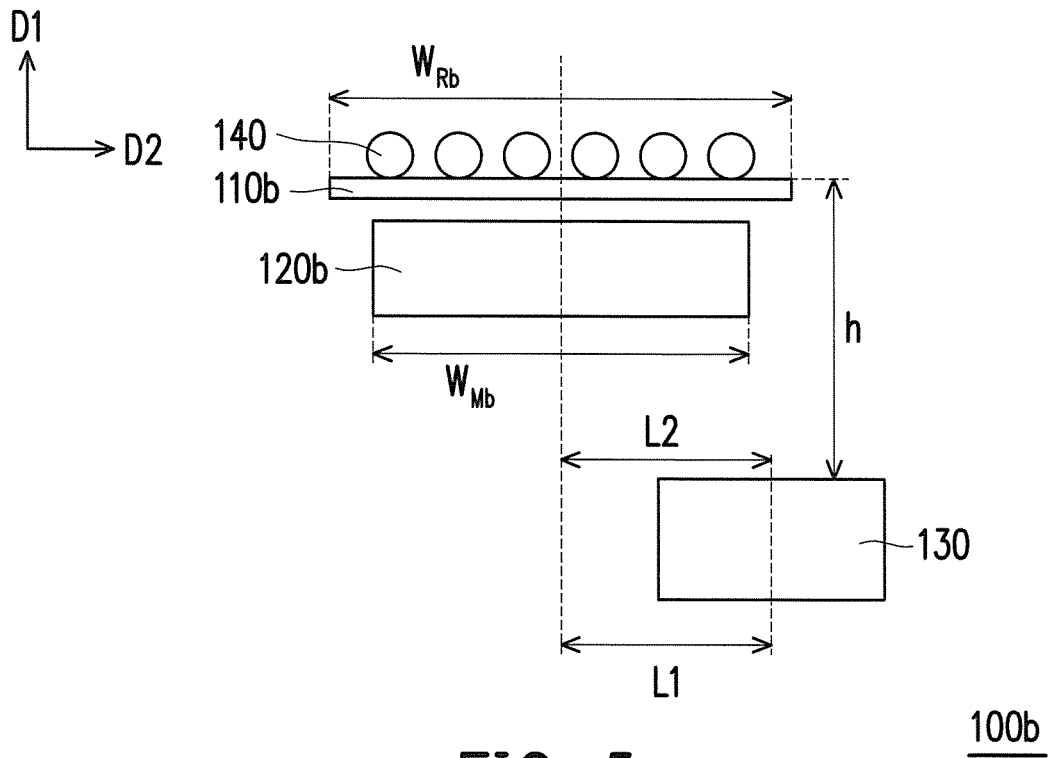
FIG. 5 is a schematic diagram illustrating a biomolecule magnetic sensor in an embodiment of the disclosure.

FIG. 5 is a schematic diagram illustrating a biomolecule magnetic sensor in an embodiment of the disclosure. A biomolecule magnetic sensor 100b has a basic structure similar to that of the embodiment in FIG. 1 with the following difference. In this embodiment, a width $W_{Rb}$ of an adsorption pad 110b is greater than a width $W_{Mb}$ of a magnetic field line generator 120b. In an embodiment, the width $W_{Rb}$ of the adsorption pad 110b may be 0.1 μm to 10 μm, and the width $W_{Mb}$ of the magnetic field line generator 120b may be greater than 0.1 μm and less than $W_{Rb}$. Enough teaching, suggestion, and implementation illustration regarding structure and detection principle of this embodiment may be obtained from the foregoing embodiments depicted in FIG. 1 to FIG. 3, and thus related description thereof are not repeated hereinafter.

Figure 6:
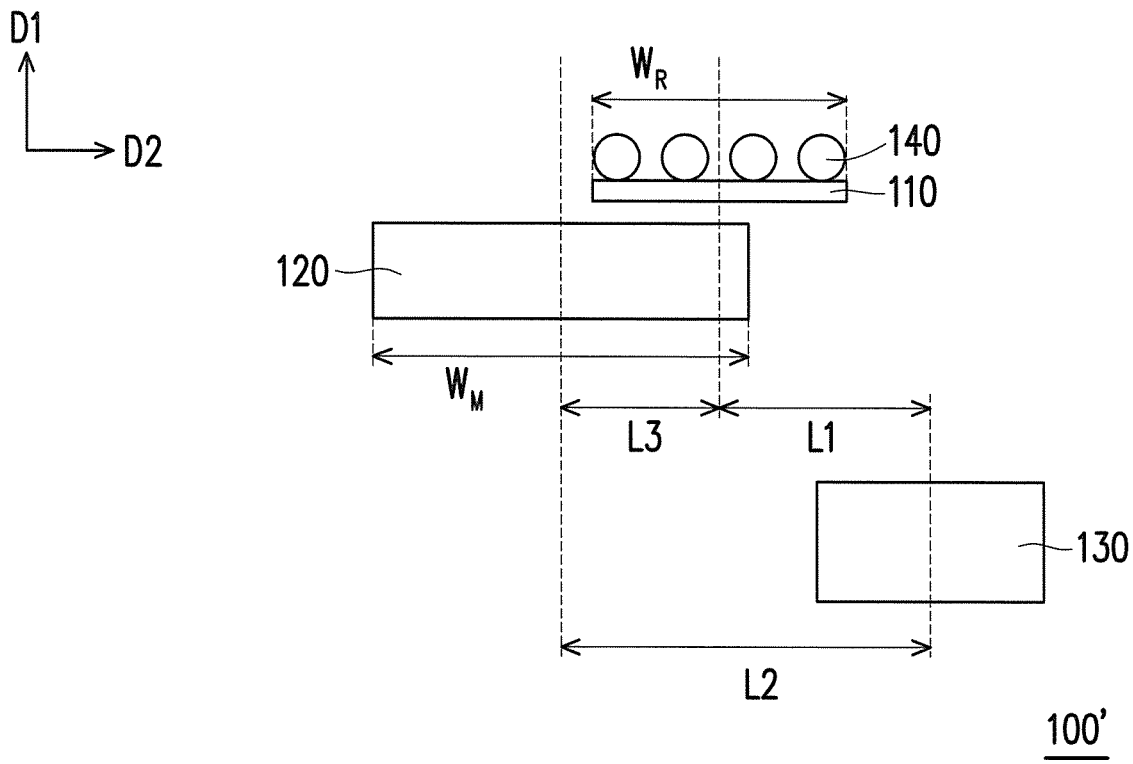
FIG. 6 is a schematic diagram illustrating a biomolecule magnetic sensor in another embodiment of the disclosure.

FIG. 6 is a schematic diagram illustrating a biomolecule magnetic sensor in another embodiment of the disclosure. A biomolecule magnetic sensor 100' has a basic structure similar to that of the embodiment in FIG. 1 with the following difference. In this embodiment, a fourth shift L3 is provided between the adsorption pad 110 and the magnetic field line generator 120 in the horizontal direction. For example, the fourth shift L3 is provided between the central axis of the adsorption pad 110 and the central axis of the magnetic field line generator 120 in the horizontal direction. The third shift L2 is substantially equal to the second shift L1 plus the fourth shift L3 (i.e., the third shift L2 is greater than the second shift L1).

In this embodiment, in the second direction D2 (i.e., the horizontal direction), the third shift L2 between the magnetic field line generator 120 and the magnetic sensor 130 is greater than the second shift L1 between the adsorption pad 110 and the magnetic sensor 130. Because what detected by the magnetic sensor 130 is a variation of the magnetic field component of the second magnetic field lines 160 in the horizontal direction, influences caused by the first magnetic field lines 150 on the magnetic sensor 130 can be reduced accordingly.

In an embodiment, the second shift L1 between the magnetic sensor 130 and the adsorption pad 110 in the second direction D2 may fall within 0 μm to $W_R$. The third shift L2 between the magnetic sensor 130 and the magnetic field line generator 120 in the second direction D2 may be greater than 0 μm and less than $0.5W_M+1.5W_R$. The fourth shift L3 between the adsorption pad 110 and the magnetic field line generator 120 may be greater than 0 μm and less than $0.5W_M+0.5W_R$. Enough teaching, suggestion, and implementation illustration regarding structure and detection principle of this embodiment may be obtained from the foregoing embodiments depicted in FIG. 1 to FIG. 3, and thus related description thereof are not repeated hereinafter.

Figure 7:
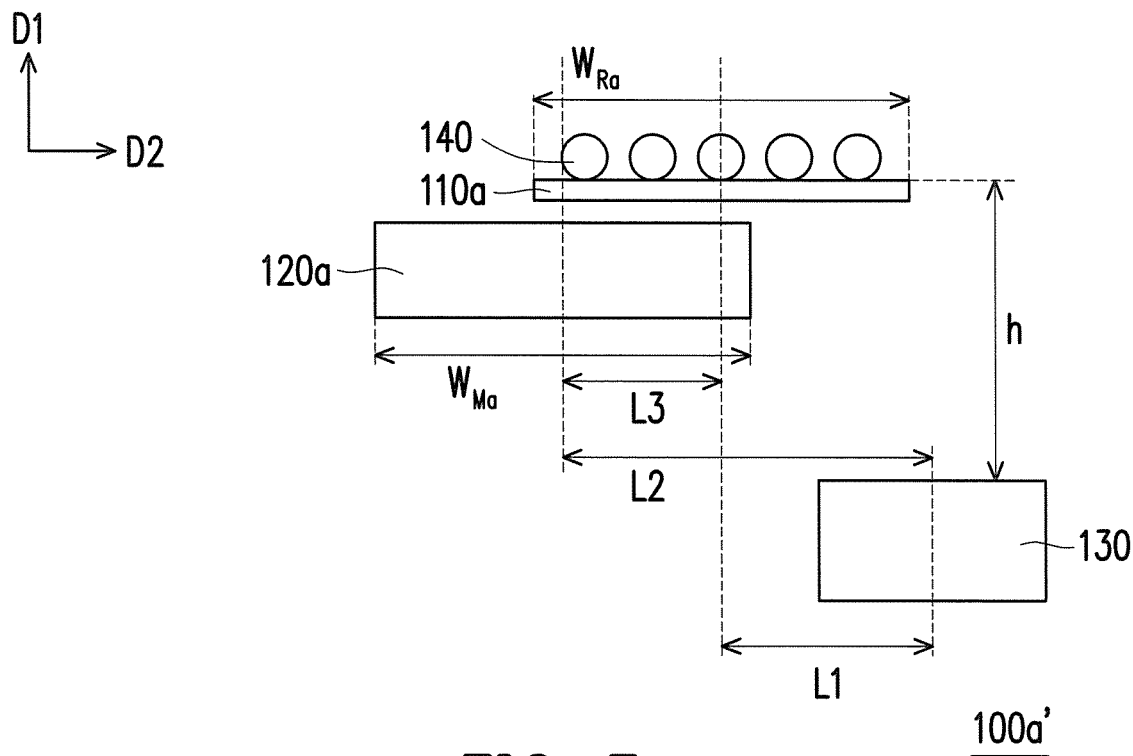
FIG. 7 and FIG. 8 are schematic diagrams respectively illustrating biomolecule magnetic sensors in another two embodiments of the disclosure.
Figure 8:
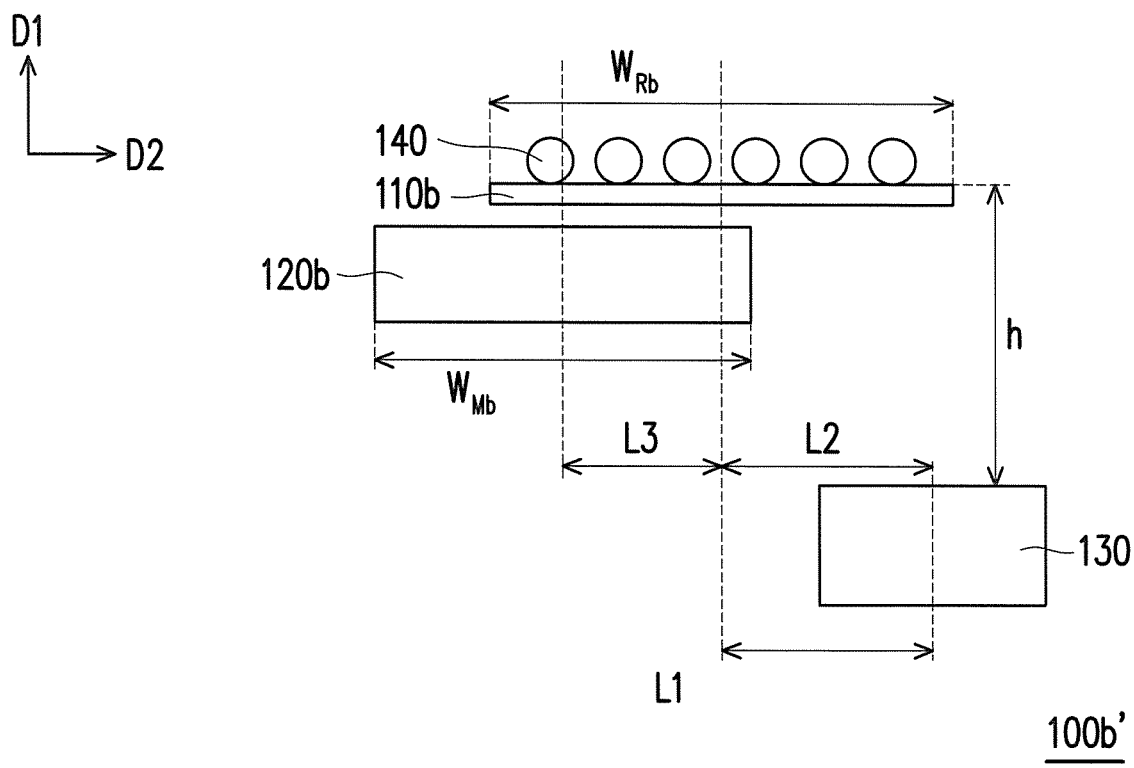

FIG. 7 and FIG. 8 are schematic diagrams respectively illustrating biomolecule magnetic sensors in another two embodiments of the disclosure. A biomolecule magnetic sensor 100a' and a biomolecule magnetic sensor 100b' have a basic structure similar to that of the embodiment in FIG. 6 with the following difference. A width $W_{Ra}$ of the adsorption pad 110a is equal to a width $W_{Ma}$ of the magnetic field line generator 120a, and a width $W_{Rb}$ of the adsorption pad 110b is greater than a width $W_{Mb}$ of the magnetic field line generator 120b. Enough teaching, suggestion, and implementation illustration regarding structure and detection principle of said two embodiments may be obtained from the foregoing embodiments, and thus related description thereof are not repeated hereinafter.

Figure 9:
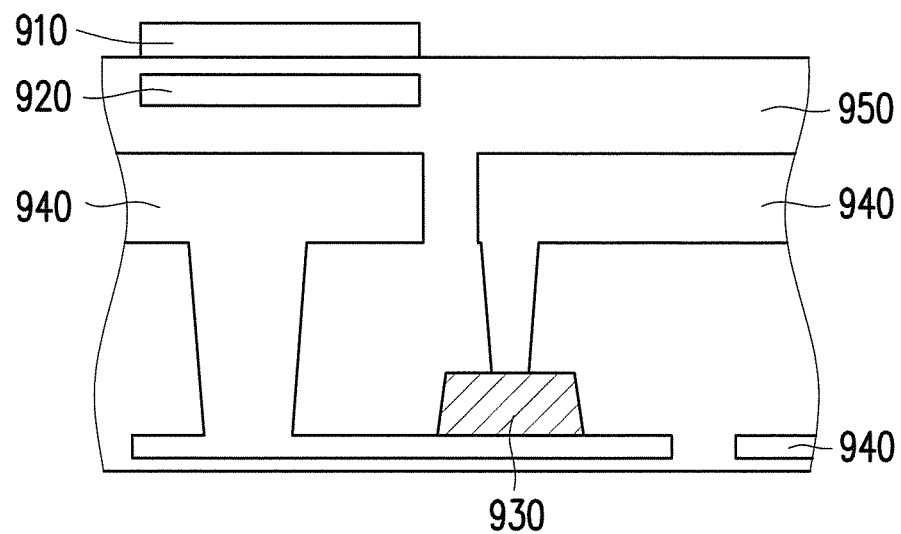
FIG. 9 is a schematic diagram illustrating a chip structure of a biomolecule magnetic sensor in another embodiment of the disclosure.

FIG. 9 is a schematic diagram illustrating a chip structure of a biomolecule magnetic sensor in another embodiment of the disclosure. Referring to FIG. 9, a biomolecule magnetic sensor 900 may be a chip. In this embodiment, a magnetic sensor 930 may be a magnetic tunnel junction (MTJ) magnetic sensor, which is coupled to a metal patterned conductive line 940. A magnetic field line generator 920 may be the magnetic thin-film layer having the magnetic moment direction perpendicular to the film surface as described above. An adsorption pad 910 may be a dielectric material. An insulating material 950 (e.g., $Si_3N_4$, $SiO_2$, etc.) can be filled in between the adsorption pad 910, the magnetic field line generator 920, the metal patterned conductive line 940 and the magnetic sensor 930. The biomolecule magnetic sensor in the present embodiment is suitable for a chip structure with reduced volume occupation, which is capable of realizing products related to handheld biological-based detector.

Figure 10:
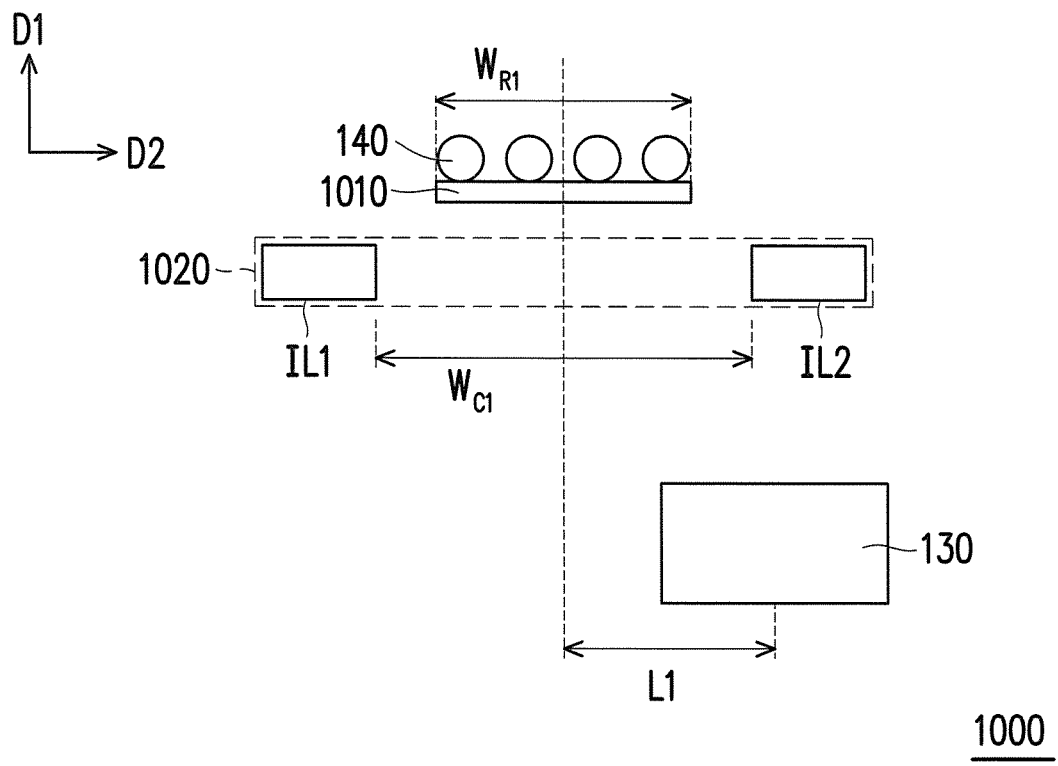
FIG. 10 is a schematic diagram illustrating a biomolecule magnetic sensor in yet another embodiment of the disclosure.

In the present embodiment, the magnetic field line generator may also be a conductive line which generates multiple first magnetic field lines through current reception. FIG. 10 is a schematic diagram illustrating a biomolecule magnetic sensor in yet another embodiment of the disclosure. A biomolecule magnetic sensor 1000 has a basic structure similar to that of the embodiment in FIG. 1 with the following difference. In this embodiment, a magnetic field line generator 1020 of the biomolecule magnetic sensor 1000 includes two straight conductive lines IL1 and IL2 arranged in parallel to each other and having a gap $W_{C1}$ in between. For example, the two straight conductive lines IL1 and IL2 extend in a direction perpendicular to the first direction D1 and the second direction D2. Moreover, the two straight conductive lines respectively receive currents I1 and I2 in opposite directions (e.g., the currents are transferred along an extending direction of the straight lines IL1 and IL2 but in opposite directions) so as to generate a plurality of first magnetic field lines perpendicular to a plane on which the conductive lines IL1 and IL2 are arranged in parallel.

A width $W_{R1}$ of an adsorption pad 1010 is less than the gap $W_{C1}$ between the two straight conductive lines IL1 and IL2. In an embodiment, the width $W_{R1}$ of the adsorption pad 1010 may fall within 0.1 μm to 10 μm, and the gap $W_{C1}$ of the magnetic field line generator 1020 may fall within 0.1 μm to 20 μm. Enough teaching, suggestion, and implementation illustration regarding structure and detection principle of this embodiment may be obtained from the foregoing embodiments depicted in FIG. 1 to FIG. 3, and thus related description thereof are not repeated hereinafter.

Figure 11:
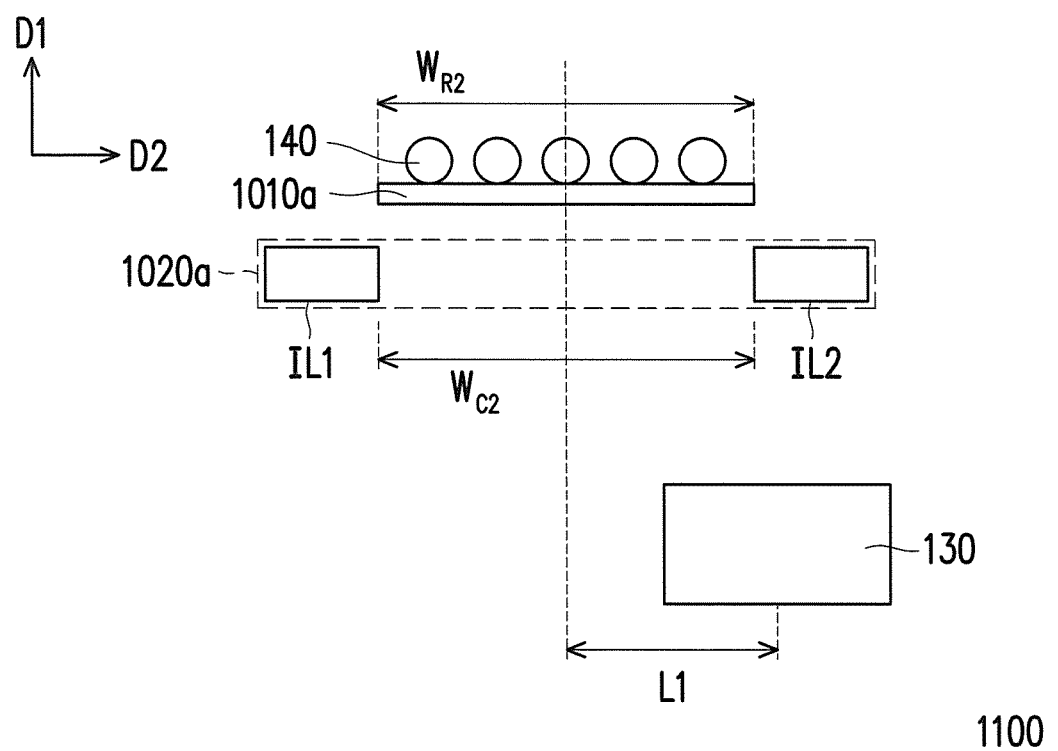
FIG. 11 and FIG. 12 are schematic diagrams respectively illustrating biomolecule magnetic sensors in another two embodiments of the disclosure.
Figure 12:
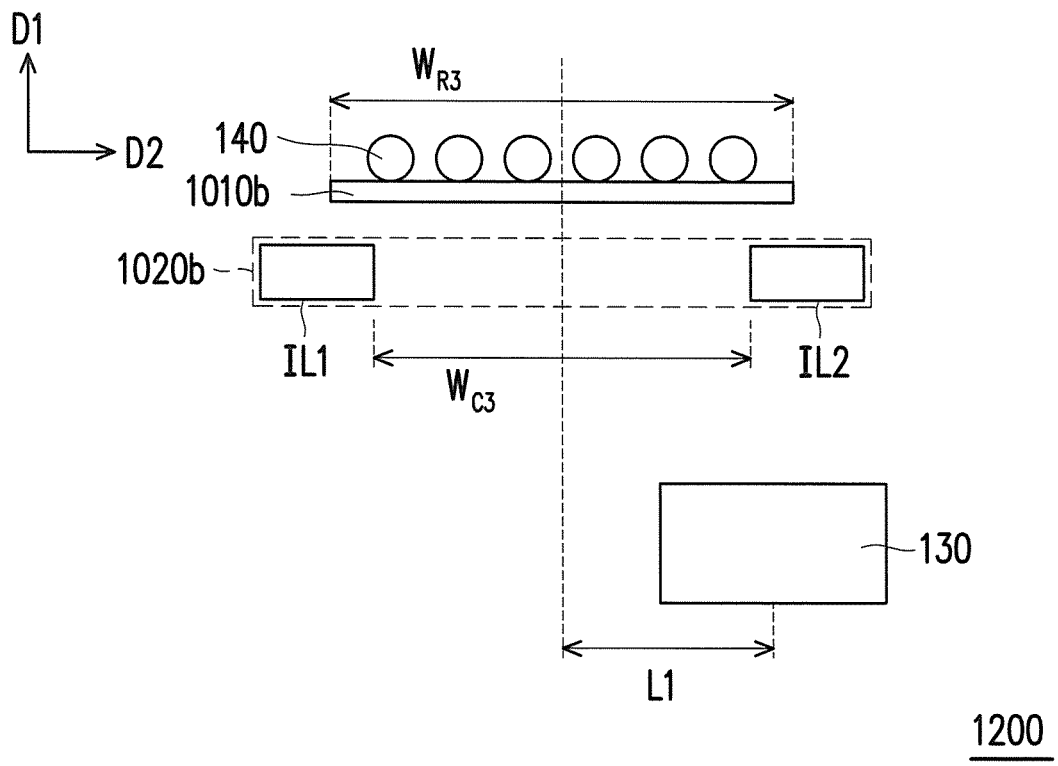

FIG. 11 and FIG. 12 are schematic diagrams respectively illustrating biomolecule magnetic sensors in another two embodiments of the disclosure. A biomolecule magnetic sensor 1100 and a biomolecule magnetic sensor 1200 have a basic structure similar to that of the embodiment in FIG. 10 with the following difference. In these two embodiments, a width $W_{R2}$ of an adsorption pad 1010a is equal to a gap $W_{C2}$ of a magnetic field line generator 1020a, and a width $W_{R3}$ of an adsorption pad 1010b is greater than a gap $W_{C3}$ of a magnetic field line generator 1020b. In an embodiment, with regard to the widths $W_{R2}$ and $W_{R3}$ of the adsorption pads 1010a and 1010b, $W_{R2}$ may be greater than 0.1 μm and less than 10 μm, and $W_{R3}$ may be greater than 0.1 μm and less than 10 μm. With regard to the gaps $W_{C2}$ and $W_{C3}$ of the magnetic field line generators 1020a and 1020b, $W_{C2}$ may be greater than 0.1 μm and less than 10 μm, and $W_{C3}$ may be greater than 0.1 μm and less than 10 μm. Enough teaching, suggestion, and implementation illustration regarding structure and detection principle of said embodiments may be obtained from the foregoing embodiments, and thus related description thereof are not repeated hereinafter.

Figure 13:
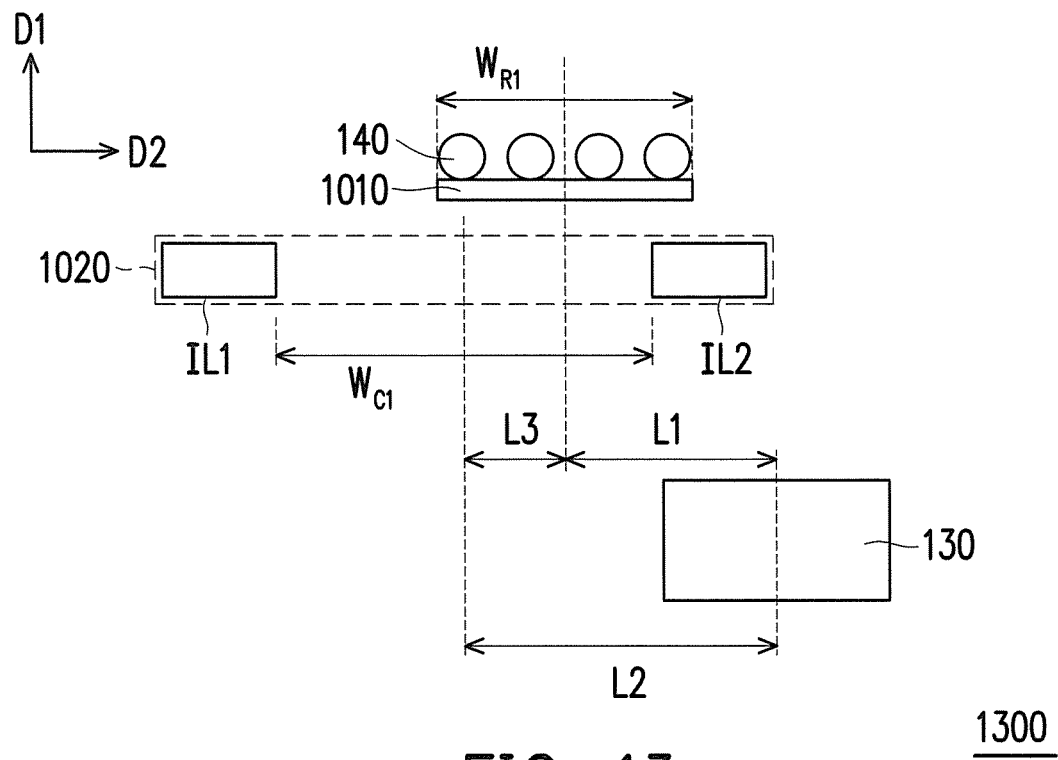
FIG. 13 is a schematic diagram illustrating a biomolecule magnetic sensor in still another embodiment of the disclosure.

FIG. 13 is a schematic diagram illustrating a biomolecule magnetic sensor in still another embodiment of the disclosure. A biomolecule magnetic sensor 1300 has a basic structure similar to that of the embodiment in FIG. 10 with the following difference. In this embodiment, a third shift L3 is provided between the adsorption pad 1010 and the magnetic field line generator 1020 in the horizontal direction. For example, the third shift L3 is provided between the central axis of the adsorption pad 1010 and the central axis of the magnetic field line generator 1020 in the horizontal direction. In an embodiment, the second shift L1 between the magnetic sensor 130 and the adsorption pad 1010 in the second direction D2 may be greater than 0 μm and less than $W_{R1}$. The third shift L2 between the magnetic sensor 130 and the magnetic field line generator 1020 in the second direction D2 may be greater than 0 μm and less than $0.5W_{C1}+1.5W_{R1}$. The third shift L3 between the adsorption pad 1010 and the magnetic field line generator 1020 may be greater than 0 μm and less than $0.5W_{C1}+0.5W_{R1}$. Enough teaching, suggestion, and implementation illustration regarding structure and detection principle of this embodiment may be obtained from the forego g embodiments depicted in FIG. 1 to FIG. 3, and thus related description thereof are not repeated hereinafter.

Figure 14:
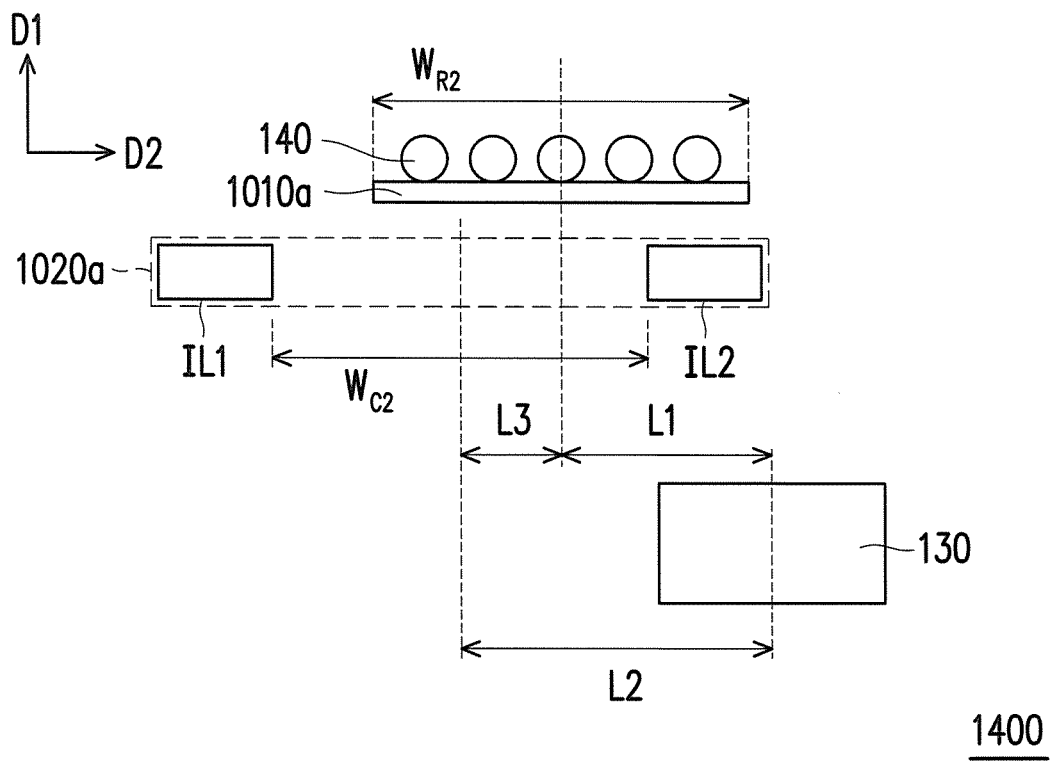
FIG. 14 and FIG. 15 are schematic diagrams respectively illustrating biomolecule magnetic sensors in another two embodiments of the disclosure.
Figure 15:
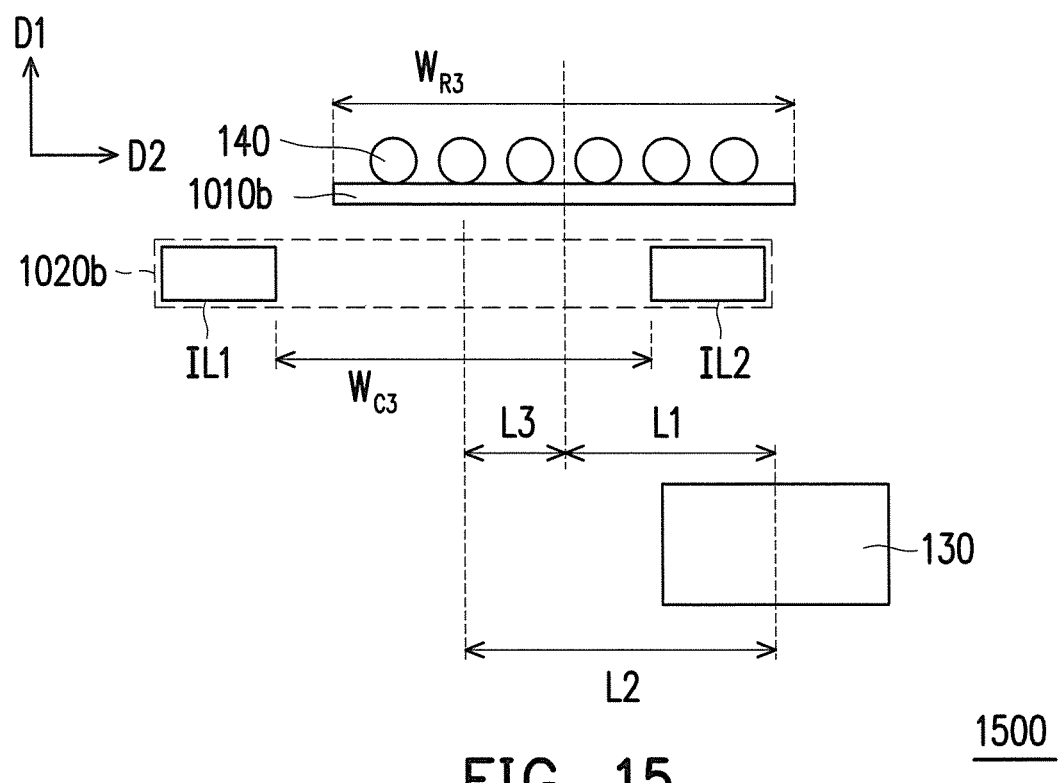

FIG. 14 and FIG. 15 are schematic diagrams respectively illustrating biomolecule magnetic sensors in another two embodiments of the disclosure. Biomolecule magnetic sensors 1400 and 1500 have a basic structure similar to that of the embodiment in FIG. 13 with the following difference. In these embodiments, the width $W_{R2}$ of the adsorption pad 1010a is equal to the gap $W_{C2}$ of the magnetic field line generator 1020a, and the width $W_{R3}$ of the adsorption pad 1010b is greater than the gap $W_{C3}$ of the magnetic field line generator 1020b. Enough teaching, suggestion, and implementation illustration regarding structure and detection principle of said embodiments may be obtained from the foregoing embodiments, and thus related description thereof are not repeated hereinafter.

Figure 16A:
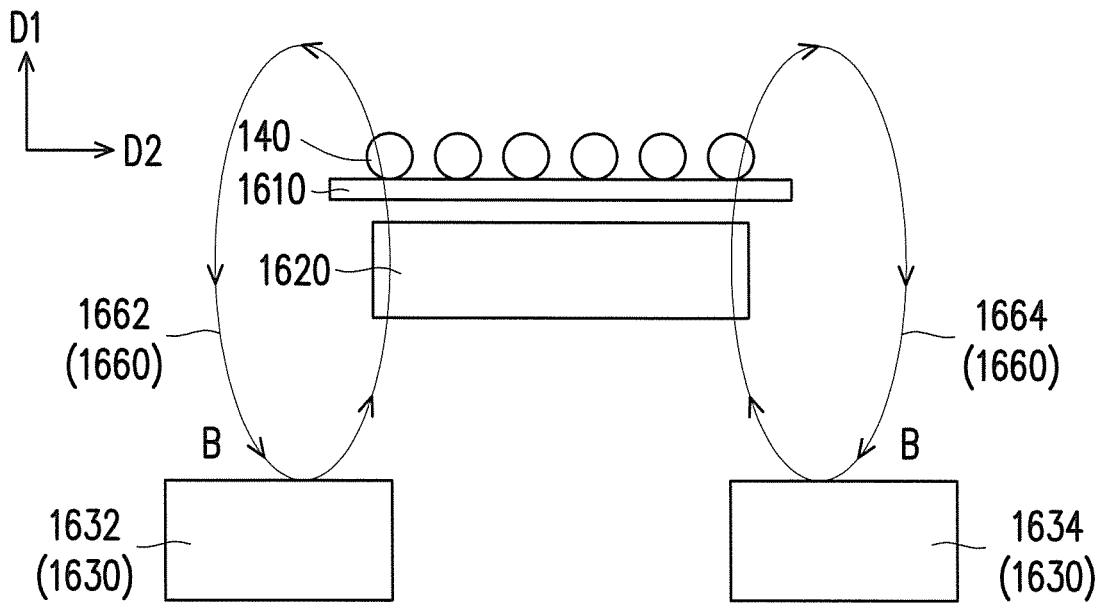
FIG. 16A illustrates a side view of a biomolecule magnetic sensor in still another embodiment of the disclosure.
Figure 16B:
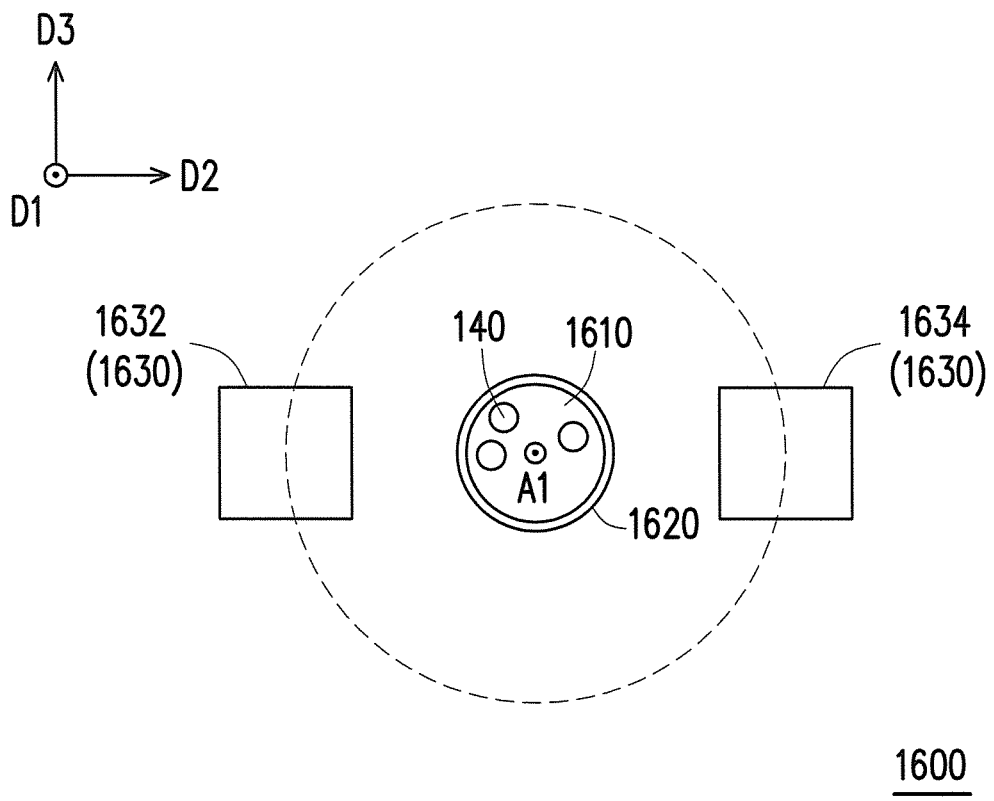
FIG. 16B illustrates a top view of FIG. 16A.

In the foregoing embodiments, although one magnetic sensor is illustrated, the number of the magnetic sensors is not particularly limited in the disclosure. FIG. 16A illustrates a side view of a biomolecule magnetic sensor in still another embodiment of the disclosure. FIG. 16B illustrates a top view of FIG. 16A. In this embodiment, a biomolecule magnetic sensor 1600 includes at least two magnetic sensors 1632 and 1634 (magnetic sensors 1630) which may be disposed on a bottom portion B of second magnetic field lines 1660. In this embodiment, an adsorption pad 1610 is in a circle shape and disposed above a magnetic field line generator 1620, and disposed positions of the magnetic sensors 1630 are symmetrically distributed in accordance with the adsorption pad 1610. The magnetic field line generator 1620 is, for example, the magnetic thin-film layer having the magnetic moment direction perpendicular to the film surface. In this embodiment, the magnetic sensors 1630 (including the magnetic sensors 1632 and 1634) have identical sensing directions, and are substantially equivalent to surrounding a central axis A1 of the adsorption pad 1610 on a plane D2-D3 (a horizontal plane) perpendicular to the first direction D1 (the first direction D1 is the vertical direction in this embodiment) because of the disposed positions with the adsorption pad 1610 as the symmetrical central axis. Accordingly, the magnetic field components of second magnetic field lines 1662 and 1664 in the second direction D2 respectively sensed by the magnetic sensors 1632 and 1634 are in opposite directions. For example, a magnetic filed direction sensed by the magnetic sensor 1632 is in the same direction of the sensing direction, and a magnetic filed direction sensed by the magnetic sensor 1634 is in the opposite direction of the sensing direction. As a result, sensing resistances sensed by the magnetic sensor 1632 and the magnetic sensor 1634 have different variations corresponding to different sensing impedances.

Figure 16C:
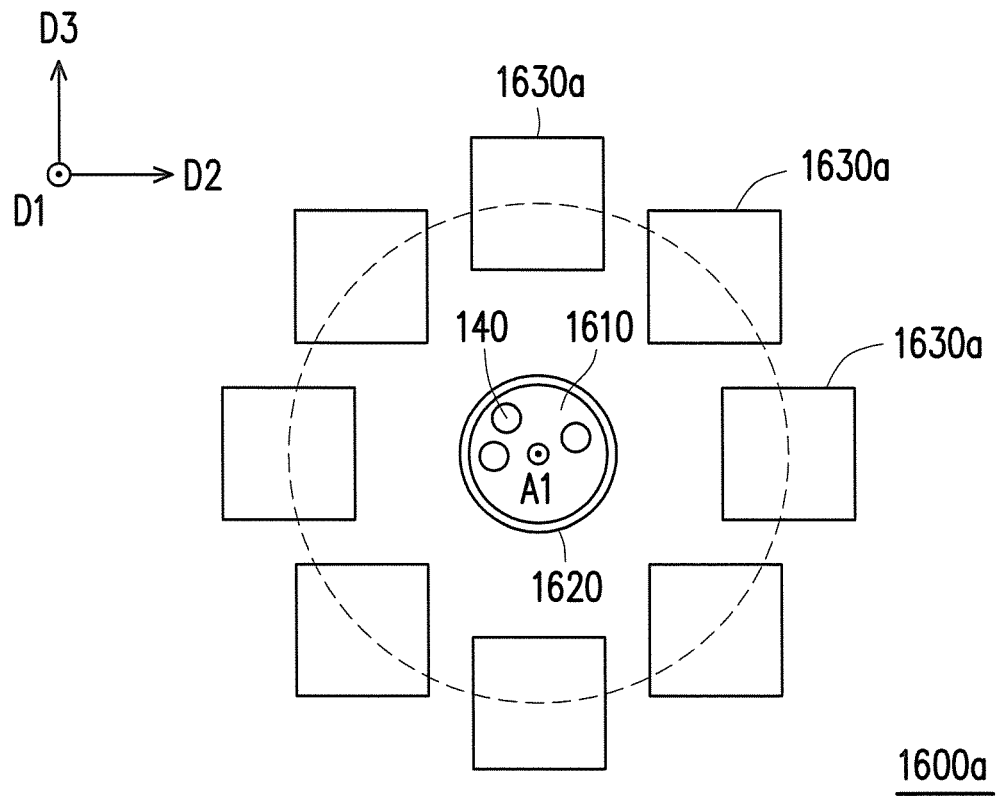
FIG. 16C illustrates a top view of a biomolecule magnetic sensor in still another embodiment of the disclosure.

FIG. 16C illustrates a top view of a biomolecule magnetic sensor in still another embodiment of the disclosure. Referring to FIG. 16, as compared to the biomolecule magnetic sensor 1600, the difference is that a biomolecule magnetic sensor 1600a includes two or more magnetic sensors 1630a. The magnetic sensors 1630a surround the central axis A1 of the adsorption pad 1610. Each of the magnetic sensors 1630a on different positions can receive a different magnetic field component, and can induce a corresponding sensing resistance based on the sensing direction own by the respective magnetic sensor 1630a. Nevertheless, enough teaching, suggestion, and implementation illustration regarding measuring principle and implementation of the sensing resistance of the magnetic sensor may be obtained with reference to common knowledge in the related art, which is not repeated hereinafter.

Figure 16D:
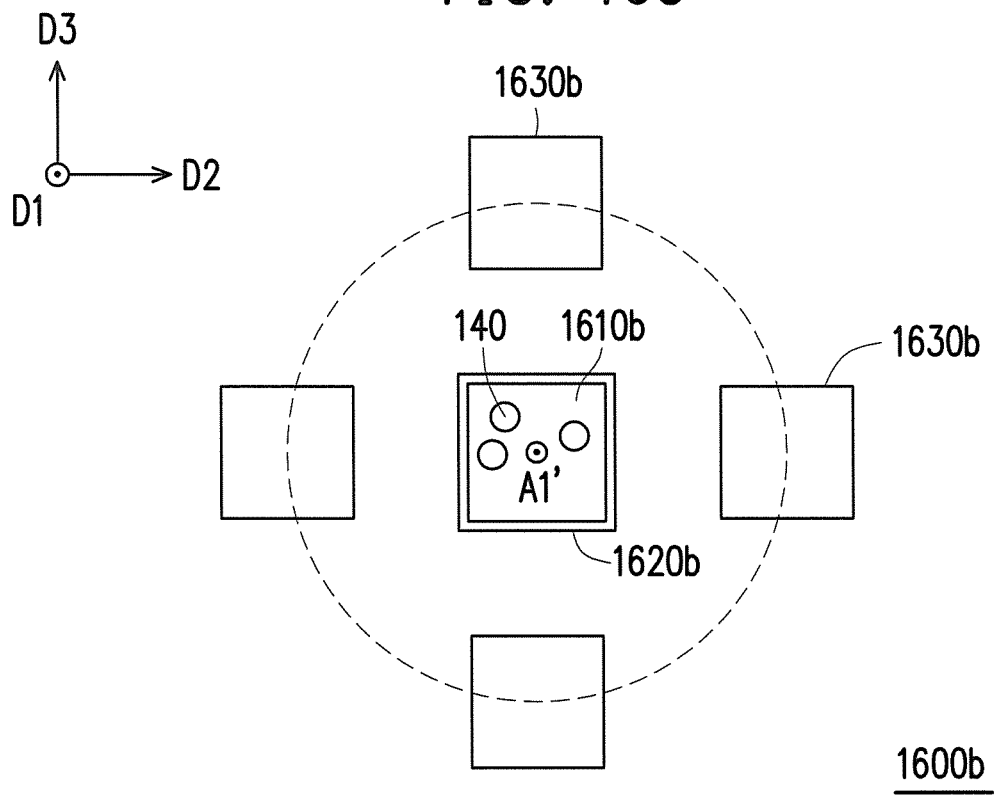
FIG. 16D illustrates a top view of a biomolecule magnetic sensor in still another embodiment of the disclosure.

FIG. 16D illustrates a top view of a biomolecule magnetic sensor in still another embodiment of the disclosure. An adsorption pad 1610b of a biomolecule magnetic sensor 1600b may be in a rectangle shape and disposed above a magnetic field line generator 1620b, and positions of the magnetic sensors 1630b are symmetrically distributed in accordance with the adsorption pad 1610b surrounding a central axis A1' of the adsorption pad 1610b.

Figure 16E:
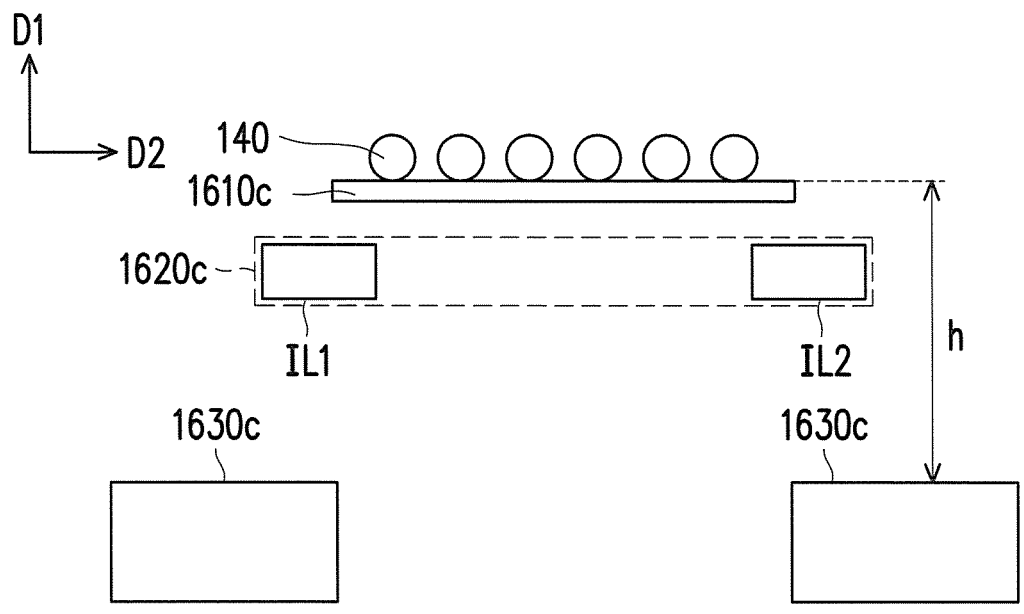
FIG. 16E illustrates a side view of a biomolecule magnetic sensor in still another embodiment of the disclosure.
Figure 16F:
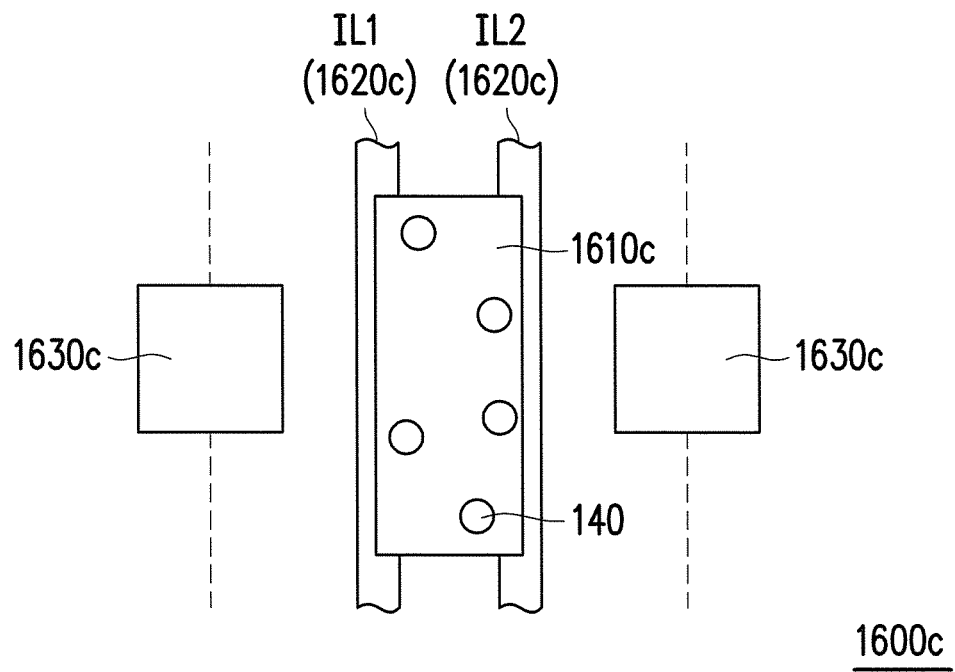
FIG. 16F illustrates a top view of FIG. 16E.

FIG. 16E illustrates a side view of a biomolecule magnetic sensor in still another embodiment of the disclosure. FIG. 16F illustrates a top view of FIG. 16E. In this embodiment, a magnetic field line generator 1620c is, for example, two metal straight conductive lines conducted with currents in opposite directions, which has structure and configuration relation identical or similar to those of the magnetic field line generators 1020, 1020a and 1020b in the foregoing embodiments. An adsorption pad 1610c has a rectangular shape, and disposed positions of the magnetic sensors 1630c are symmetrically distributed in accordance with the adsorption pad 1610c. Enough teaching, suggestion, and implementation illustration regarding structure and detection principle of said embodiments may be obtained from the foregoing embodiments, and thus related description thereof are not repeated hereinafter.

Figure 17A:
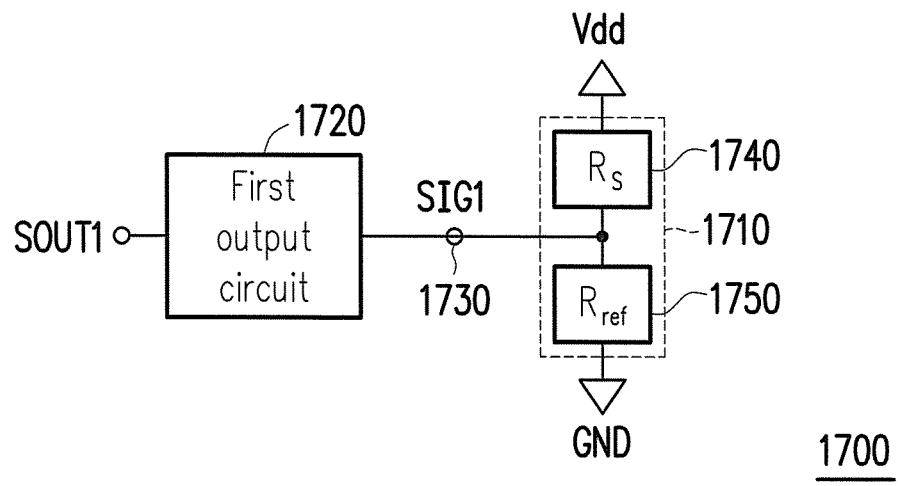
FIG. 17A is a schematic diagram illustrating circuitry of a biomolecule magnetic sensor in an embodiment of the disclosure.

FIG. 17A is a schematic diagram illustrating circuitry of a biomolecule magnetic sensor in an embodiment of the disclosure. A biomolecule magnetic sensor 1700 further includes a first magnetic sensing circuit 1710 and a first output circuit 1720. The first magnetic sensing circuit 1710 includes a magnetic sensor 1740 having a sensing impedance (e.g., a sensing resistance Rs) and a reference impedor 1750 (a reference resistance Rref), and the magnetic sensor 1740 and the reference impedor 1750 are coupled to a first output terminal 1730 to output a first sensing output signal SIG1. In the present embodiment, the magnetic sensor 1740 may be any magnetic sensor in the aforementioned embodiments with reference to FIG. 3 to FIG. 15, which is not particularly limited by the disclosure. The magnetic sensor 1740 generates the corresponding sensing resistance Rs according to the magnetic field component in the horizontal direction and its own sensing direction. For example, the reference resistance Rref of the reference impedor 1750 is an impedance element with a constant resistance. In the present embodiment, the sensing resistance Rs has one terminal coupled to a first reference voltage (e.g., a system voltage Vdd) and another terminal coupled to the reference resistance Rref, and another terminal of the reference resistance Rref is coupled to a second reference voltage (e.g., a ground voltage GND).

In the present embodiment, the first output terminal 1730 is coupled to the sensing resistance $R_{ref}$ and the reference resistance $R_{ref}$, and outputs the first sensing output signal SIG1. The first sensing output signal SIG1 corresponds to a ratio of the reference resistance $R_{ref}$ and the sensing resistance $R_s$. The first output circuit 1720 is coupled to the first output terminal 1730 to receive the first sensing output signal SIG1 and output a first sensing signal SOUT1 according to the first sensing output signal SIG1. Density, amount or concentration of biomolecule to be measured may be estimated according to the first sensing signal SOUT1.

Figure 17B:
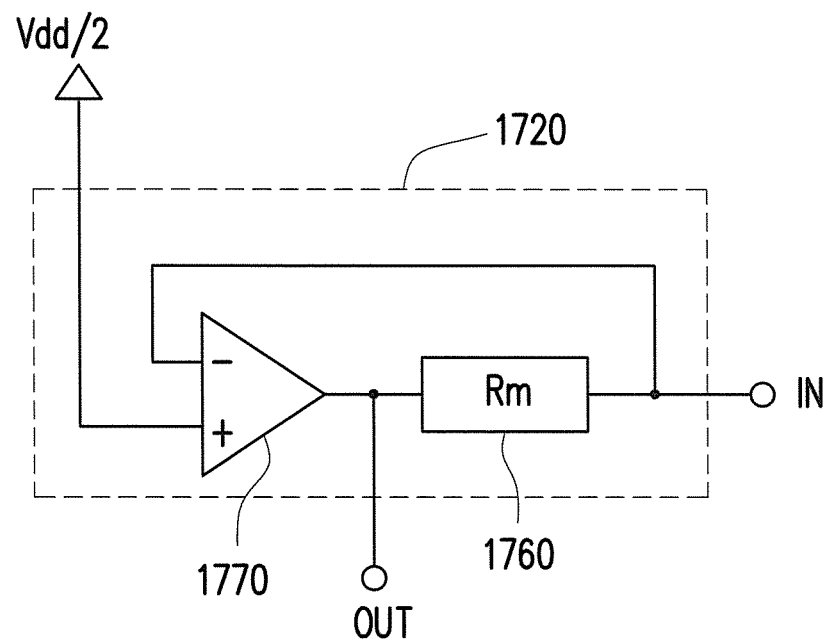
FIG. 17B is a schematic diagram illustrating internal circuitry of an output circuit according to an embodiment of the disclosure.

FIG. 17B is a schematic diagram illustrating internal circuitry of the first output circuit 1720. The first output circuit includes an operational amplifier 1770, an impedor 1760 (with a resistance $R_m$), an input terminal IN and an output terminal OUT. The input terminal IN receives the first sensing output signal SIG1 and is coupled to an inverse input terminal of the operational amplifier 1770, and the output terminal OUT is coupled to an output terminal of the operational amplifier 1770 to output the first sensing signal SOUT1. The impedor 1760 has one terminal coupled to the input terminal IN and another terminal coupled to the output terminal OUT. The operational amplifier 1770 has a non-inverse input terminal coupled one half the first reference voltage (e.g., Vdd/2) and the inverse input terminal coupled to the input terminal IN, receives the first sensing output signal SIG1 and performs a differential amplification output on Vdd/2 and the first sensing output signal SIG1. When the sensing resistance $R_s$ causes the first sensing output signal SIG1 to float due to variations in the external magnetic field, the number of the magnetic beads or the to-be-measured biomolecule on the magnetic beads, the output circuit 1720 performs a calculation base on the inputted first sensing output signal SIG1 and one half the first reference voltage (Vdd/2) in order to output the first sensing signal SOUT1.

The internal circuitry illustrated in the schematic diagram of FIG. 17B is an example used to describe implementation of the output circuit of the disclosure rather than limit the disclosure.

Figure 18:
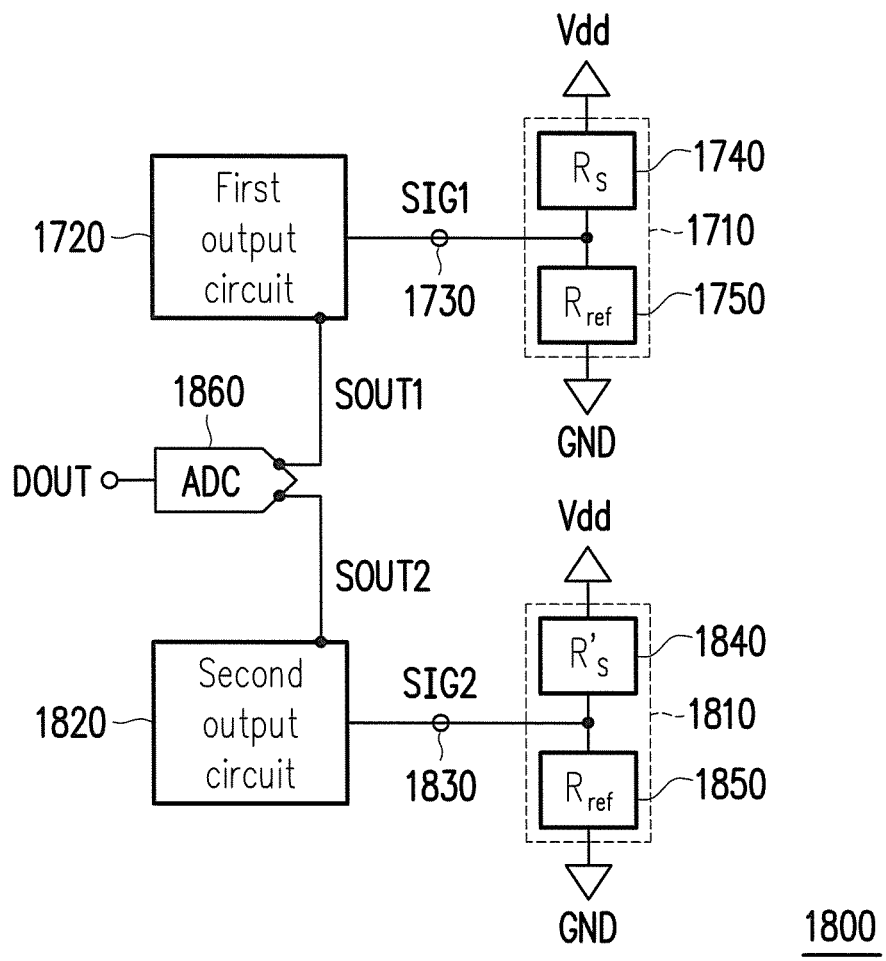
FIG. 18 is a schematic diagram illustrating circuitry of a biomolecule magnetic sensor in another embodiment of the disclosure.

FIG. 18 is a schematic diagram illustrating circuitry of a biomolecule magnetic sensor in another embodiment of the disclosure. Compared to the biomolecule magnetic sensor 1700, a biomolecule magnetic sensor 1800 further includes a second magnetic sensing circuit 1810, a second output circuit 1820 and an analog-to-digital conversion circuit 1860.

The second magnetic sensing circuit 1810 includes a reference magnetic sensor 1840 having a reference sensing impedor (e.g., a reference sensing impedance R's) and another reference impedor 1850 (e.g., the reference impedance Rref). A reference magnetic sensor 1840 and the reference impedor 1850 are coupled to a second output terminal 1830 to output a second sensing output signal SIG2. Another magnetic field line generator is disposed next to the reference magnetic sensor 1840, and no magnetic bead is provided on said another magnetic field line generator.

Structural details, disposition relation and implementation of the reference magnetic sensor 1840 and the another magnetic field line generator are identical or similar to structural details, disposition relation and implementation of the magnetic sensor and the magnetic field line generator described in the exemplary embodiments in FIG. 3 to FIG. 8 so enough teaching, suggestion, and implementation illustration regarding the above can be obtained from the descriptions for FIG. 3 to FIG. 8, and thus related descriptions are not repeated hereinafter.

In other words, the biomolecule magnetic sensor 1800 includes at least two magnetic sensors 1740 and 1840 (one of which serves as the reference magnetic sensor), and at least two magnetic field line generator. No magnetic bead is provided on the magnetic field line generator corresponding to the reference magnetic sensor 1840.

Structure and implementation of the reference magnetic sensor 1840 is similar to those of aforesaid magnetic sensors, and may be any one of the magnetic sensors 130, 1630, 1630a or 1630b, or the magnetic sensor 1740 of the first magnetic sensing circuit 1710 in the foregoing embodiments, for example. The difference is that, what sensed by the aforesaid magnetic sensors is the magnetic field component of the second field lines in the second direction generated by the magnetic beads adsorbed on the adsorption pad and no magnetic bead is provided on the magnetic field line generator corresponding to the magnetic sensor 1840. Therefore, the reference magnetic sensor 1840 detects the magnetic field component of at least one of magnetic field lines generated by the corresponding magnetic field line generator in the second direction because no additional magnetic field is generated, and then generate the corresponding reference sensing resistance $R'_s$.

Similarly, in the present embodiment, the reference sensing resistance $R'_s$ has one terminal coupled the first reference voltage (the system voltage Vdd) and another terminal coupled to the reference resistance $R_{ref}$, and another terminal of the reference resistance $R_{ref}$ is coupled to the second reference voltage (e.g., the ground voltage GND). The second output terminal 1830 is coupled to the reference sensing resistance $R'_s$ and the reference resistance $R_{ref}$ and outputs the second sensing output signal SIG2. The second sensing output signal SIG2 corresponds to a ratio of the reference sensing resistance $R'_s$ and the reference resistance $R_{ref}$.

The second output circuit 1820 is coupled to the second output terminal 1830 to receive the second sensing output signal SIG2 and generate a second sensing signal SOUT2 according to the second sensing output signal SIG2. Enough teaching, suggestion, and implementation illustration regarding internal circuit structure, disposed relation and implementation of the second output circuit may be obtained from the foregoing embodiments depicted in FIG. 17B, and thus related description thereof are not repeated hereinafter. For the second output circuit 1820, what received by the input terminal IN is the second sensing output signal SIG2, and what outputted by the output terminal OUT is the second sensing signal SOUT2.

The analog-to-digital conversion circuit 1860 is coupled to the first output circuit 1720 and the second output circuit 1820, and configured to receive the first sensing signal SOUT1 and the second sensing signal SOUT2 being analog signals and convert the first sensing signal SOUT1 and the second sensing signal SOUT2 into a digital sensing signal DOUT. Density, amount or concentration of biomolecule to be measured may be estimated according to the digital sensing signal DOUT.

Figure 19:
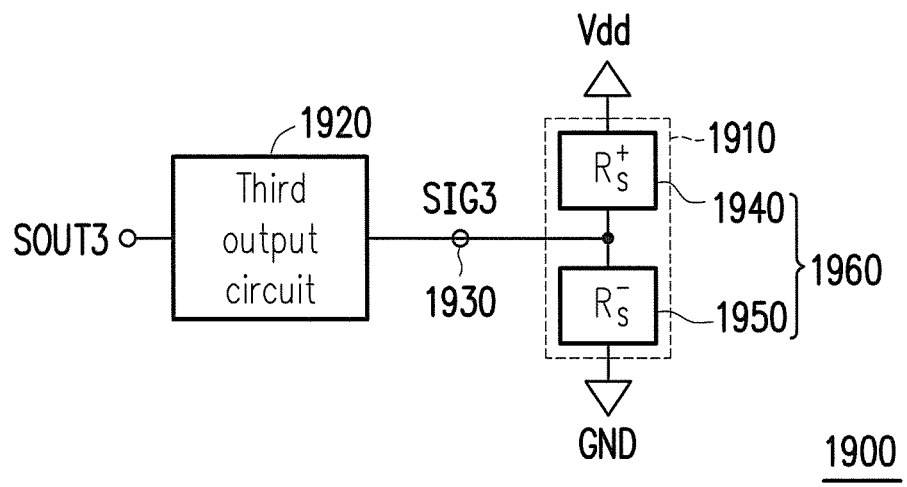
FIG. 19 is a schematic diagram illustrating circuitry of a biomolecule magnetic sensor in another embodiment of the disclosure.

FIG. 19 is a schematic diagram illustrating circuitry of a biomolecule magnetic sensor in another embodiment of the disclosure. A biomolecule magnetic sensor 1900 further includes a third magnetic sensing circuit 1910 and a third output circuit 1920. The third output circuit 1920 is coupled to the third magnetic sensing circuit 1910.

The third magnetic sensing circuit 1910 includes at least one magnetic sensor set 1960. Each said magnetic sensor set 1960 includes two magnetic sensors 1940 and 1950. Both the two magnetic sensors 1940 and 1950 sense, for example, the second magnetic field lines generated by the magnetic beads on the same adsorption pad, and correspond to the multiple magnetic sensors (1630, 1630a, 1630b and 1630c) of the same adsorption pad adsorbed with the magnetic beads (referring FIG. 16A to FIG. 16F). The magnetic sensors 1940 and 1950 are disposed on different positions (e.g., symmetrically distributed in accordance with the same adsorption pad) to generate the corresponding sensing resistances (e.g., a positive sensing resistance $R_s^+$ and a negative sensing resistance $R_s^-$) according to the sensing direction and the detected magnetic field component of each of the magnetic sensors 1940 and 1950.

With reference to FIGS. 16A, 16B, 16E and 16F, for example, the positive sensing resistance $R_s^+$ means that the magnetic field component of the second magnetic filed lines in the second direction received by the magnetic sensor 1940 is in the same direction as the sensing direction, and the negative sensing resistance $R_s^-$ means the magnetic field component of the second magnetic filed lines in the second direction received by the corresponding magnetic sensor 1950 is in the opposite direction of the sensing direction.

Similarly, the positive sensing resistor $R_s^+$ has one terminal coupled to the first reference voltage (e.g., the system voltage Vdd) and another terminal coupled to the negative sensing resistance $R_s^-$, and another terminal of the negative resistance $R_s^-$ is coupled to the second reference voltage (e.g., the ground voltage GND). A third output terminal 1930 is coupled to the positive sensing resistance $R_s^+$ and the negative sensing resistance $R_s^-$ and outputs a third sensing output signal SIG3. The third sensing output signal SIG3 corresponds to a ratio of the positive sensing resistance $R_s^+$ and the negative sensing resistance $R_s^-$.

The third output circuit 1920 is coupled to the third output terminal 1930 to receive the third sensing output signal SIG3 and generate a third sensing signal SOUT3 according to the third sensing output signal SIG3. Enough teaching, suggestion, and implementation illustration regarding internal circuit structure, disposed relation and implementation of the third output circuit may be obtained from the foregoing embodiments depicted in FIG. 17B, and thus related description thereof are not repeated hereinafter. For the third output circuit 1920, what received by the input terminal IN is the third sensing output signal SIG3, and what outputted by the output terminal OUT is the third sensing signal SOUT3.

Figure 20:
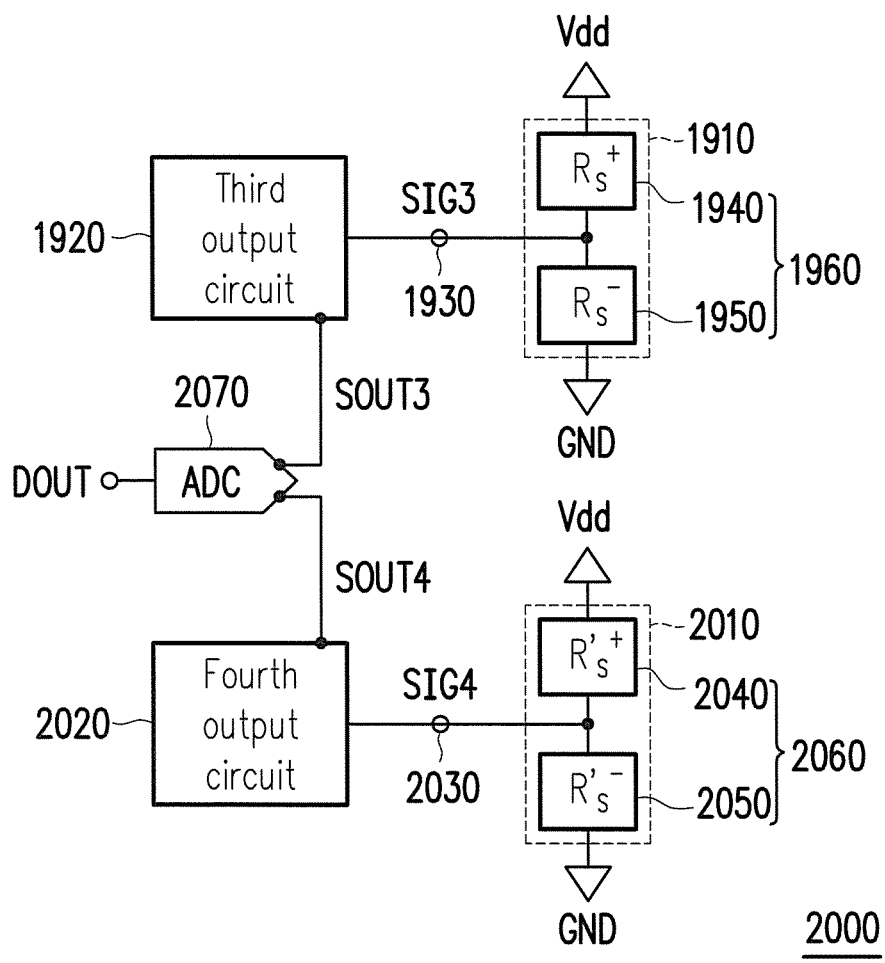
FIG. 20 is a schematic diagram illustrating circuitry of a biomolecule magnetic sensor in another embodiment of the disclosure.

FIG. 20 is a schematic diagram illustrating circuitry of a biomolecule magnetic sensor in another embodiment of the disclosure. Compared to the biomolecule magnetic sensor 1900, a biomolecule magnetic sensor 2000 further includes a fourth magnetic sensing circuit 2010, a fourth output circuit 2020 and an analog-to-digital conversion circuit 2070.

The fourth magnetic sensing circuit 2010 includes at least one reference magnetic sensor set 2060. The reference magnetic sensor set 2060 includes two magnetic sensors 2040 and 2050. As described above, another magnetic field line generator is disposed next the reference magnetic sensor set 2060, and no magnetic bead is provided on such magnetic field line generator.

Structural details, disposition relation and implementation of the reference magnetic sensor 2060 and the another magnetic field line generator are identical or similar to those of the magnetic sensor and the magnetic field line generator described in the exemplary embodiments in FIG. 16A to FIG. 16F, and enough teaching, suggestion, and implementation illustration regarding the magnetic sensor set 1960 can be obtained from the descriptions from FIG. 19, and thus related descriptions are not repeated hereinafter.

Both the two magnetic sensors 2040 and 2050 correspond to, for example, the magnetic field line generator on which no magnetic bead is provided, and therefore sense at least one of the first magnetic field lines generated by the magnetic field line generator on which no magnetic bead is provided. In other words, the biomolecule magnetic sensor 2000 includes at least four magnetic sensors 1940, 1950, 2040 and 2050 (two of which are reference magnetic sensors) and at least two of magnetic field line generators. No magnetic bead is provided on the magnetic field line generator corresponding to the reference magnetic sensors 2040 and 2050.

With reference to FIGS. 16A and 16B, for example, the positive reference sensing resistance $R'_s{}^+$ means that the magnetic field component of the first magnetic filed lines in the second direction received by the magnetic sensor 2040 is in the same direction of the sensing direction, and the negative sensing resistance $R'_s{}^-$ means that the magnetic field component of the first magnetic filed lines in the second direction received by the magnetic sensor 2050 is in the opposite direction of the sensing direction.

Similarly, a positive reference sensing resistance R's+ has one terminal coupled to the first reference voltage (e.g., the system voltage Vdd) and another terminal coupled to a negative reference sensing resistance R's−, and another terminal of the negative reference sensing resistance R's− is coupled to the second reference voltage (e.g., the ground voltage GND). A fourth output terminal 2030 is coupled to the positive reference sensing resistance R's+ and the negative reference sensing resistance R's− and outputs a fourth sensing output signal SIG4. The fourth sensing output signal SIG4 corresponds to a ratio of the positive reference sensing resistance R's+ and the negative reference sensing resistance R's−.

The fourth output circuit 2020 is coupled to the fourth output terminal 2030 to receive the fourth sensing output signal SIG4 and generate a fourth sensing signal SOUT4 according to the fourth sensing output signal SIG4. Enough teaching, suggestion, and implementation illustration regarding internal circuit structure, disposed relation and implementation of the fourth output circuit may be obtained from the foregoing embodiments depicted in FIG. 17B, and thus related description thereof are not repeated hereinafter. For the fourth output circuit 2020, what received by the input terminal IN is the fourth sensing output signal SIG4, and what outputted by the output terminal OUT is the fourth sensing signal SOUT4.

The analog-to-digital conversion circuit 2070 is coupled to the third output circuit 1920 and the fourth output circuit 2020, and configured to receive the third sensing signal SOUT3 and the fourth sensing signal SOUT4 being analog signals and convert the third sensing signal SOUT3 and the fourth sensing signal SOUT4 being analog signals into a digital sensing signal DOUT. Density, amount or concentration of biomolecule to be measured may be estimated according to the digital sensing signal DOUT.

Figure 21:
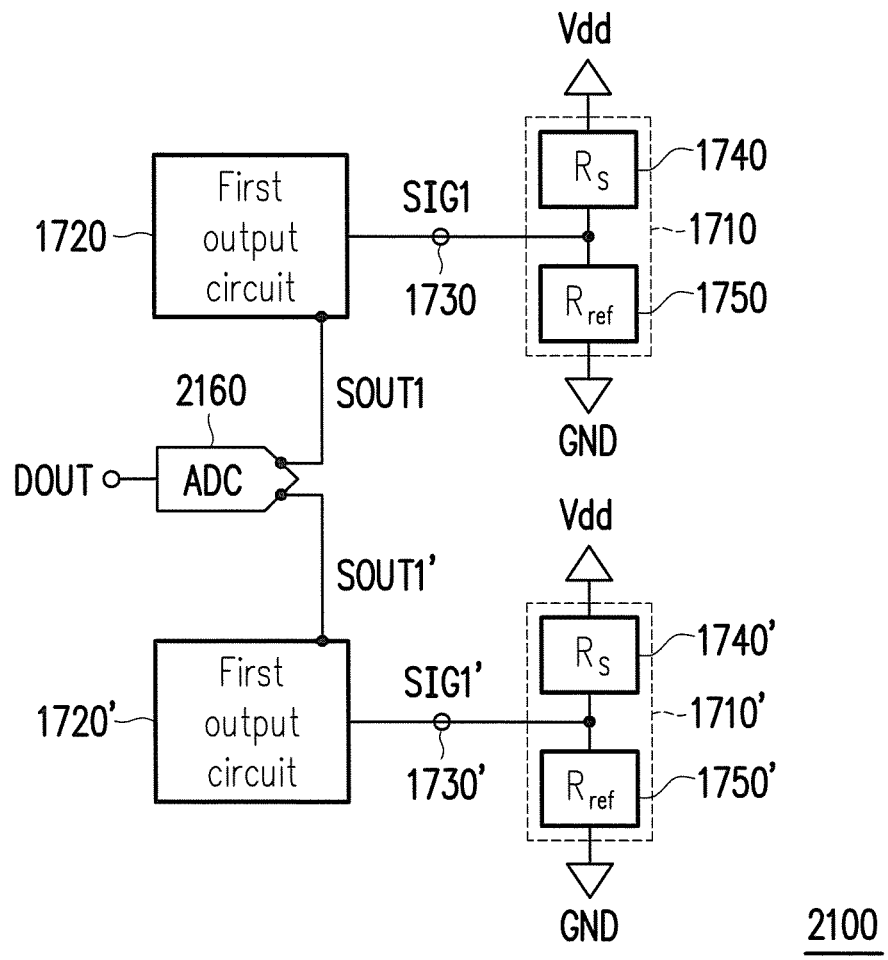
FIG. 21 is a schematic diagram illustrating circuitry of a biomolecule magnetic sensor in another embodiment of the disclosure.

FIG. 21 is a schematic diagram illustrating circuitry of a biomolecule magnetic sensor in another embodiment of the disclosure. Compared to the biomolecule magnetic sensor 1700, a biomolecule magnetic sensor 2100 further includes another first magnetic sensing circuit 1710', another first output circuit 1720' and an analog-to-digital conversion circuit 2160.

The another first output circuit 1720' can output another first sensing signal SOUT1'. Enough teaching, suggestion, and implementation illustration regarding circuit internal structure, disposed relation and implementation of the another first magnetic sensing circuit 1710' and the another first output circuit 1720' may be obtained from the foregoing embodiments depicted in FIGS. 17A and 17B, and thus related description thereof are not repeated hereinafter.

In other words, the biomolecule magnetic sensor 2100 includes at least two magnetic sensors (1740 and 1740'), two reference impedors (1750 and 1750') and at least two magnetic field line generators. The magnetic beads are adsorbed on the two magnetic field line generators and configured to generate the second magnetic field lines. In the present embodiment, the magnetic field line generator corresponding to the first magnetic sensing circuit 1710' and the magnetic field line generator corresponding to the first magnetic sensing circuit 1710' may be the conductive lines, and directions of the currents conducting which are opposite to thereby generate the magnetic field lines in opposite directions.

The analog-to-digital conversion circuit 2160 is coupled to the first output circuit 1720 and the another first output circuit 1720', and configured to receive the first sensing signal SOUT1 and the another first sensing signal SOUT1' being analog signals and convert the first sensing signal SOUT1 and the another first sensing signal SOUT1' being analog signals into a digital sensing signal DOUT. Density, amount or concentration of biomolecule to be measured may be estimated according to the digital sensing signal DOUT.

In addition, in the present embodiment, enough teaching, suggestion, and implementation illustration for implementation, circuit scheme and disposed relation regarding the biomolecule magnetic sensor 2100 can be obtained from the above embodiments in FIG. 17 to FIG. 20, thus related descriptions thereof are not repeated hereinafter.

Figure 22:
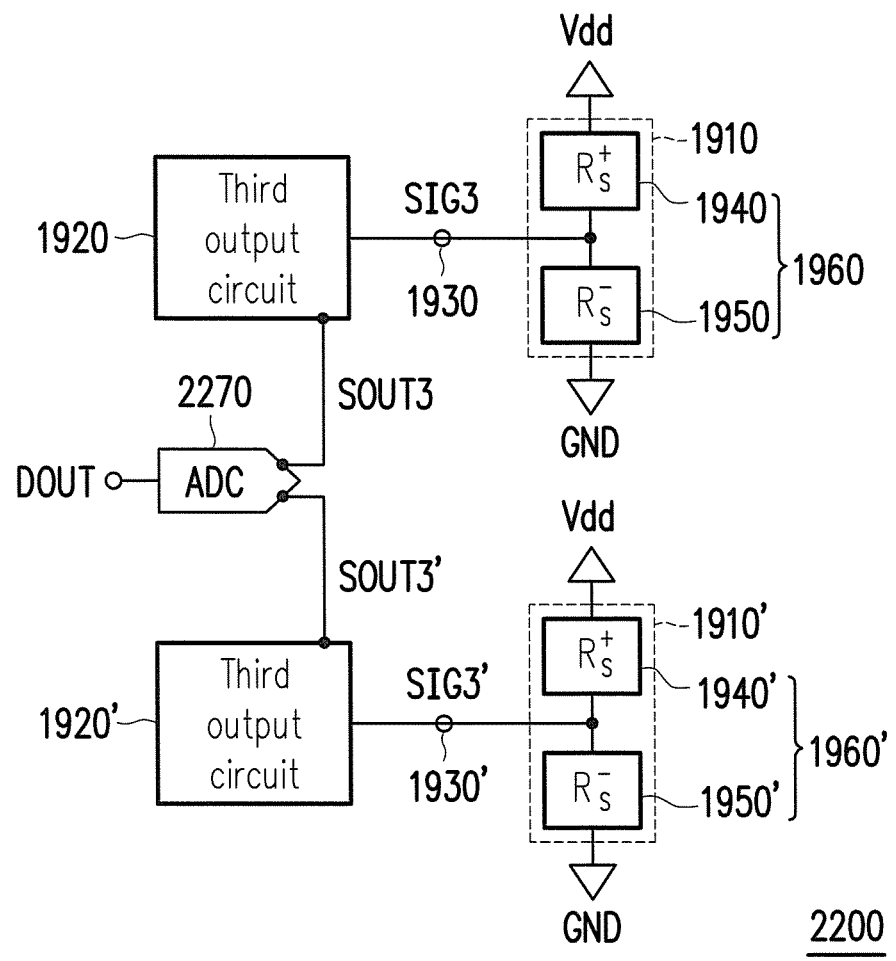
FIG. 22 is a schematic diagram illustrating circuitry of a biomolecule magnetic sensor in another embodiment of the disclosure.

FIG. 22 is a schematic diagram illustrating circuitry of a biomolecule magnetic sensor in another embodiment of the disclosure. Compared to the biomolecule magnetic sensor 1900, a biomolecule magnetic sensor 2200 further includes another third magnetic sensing circuit 1910', another third output circuit 1920' and an analog-to-digital conversion circuit 2270. In the present embodiment, the magnetic field line generator corresponding to the third magnetic sensing circuit 1910 and the magnetic field line generator corresponding to the another third magnetic sensing circuit 1910' may be the conductive lines, and directions of the currents conducting which are opposite to thereby generate the magnetic field lines in opposite directions.

The another third output circuit 1920' can output another third sensing signal SOUT3'. Enough teaching, suggestion, and implementation illustration regarding circuit internal structure, disposed relation and implementation of the another third magnetic sensing circuit 1910' and the another third output circuit 1920' may be obtained from the foregoing embodiments depicted in FIG. 19, and thus related description thereof are not repeated hereinafter.

In other words, the biomolecule magnetic sensor 2200 includes at least four magnetic sensors (1940, 1950, 1940' and 1950') and at least two magnetic field line generators. The magnetic beads are adsorbed on the two magnetic field line generators and configured to generate the second magnetic field lines.

The analog-to-digital conversion circuit 2270 is coupled to the third output circuit 1920 and the another third output circuit 1920', and configured to receive the third sensing signal SOUT3 and another third sensing signal SOUT3' being analog signals and convert the third sensing signal SOUT3 and the another third sensing signal SOUT3' being analog signals into a digital sensing signal DOUT. Density, amount or concentration of biomolecule to be measured may be estimated according to the digital sensing signal DOUT.

In addition, in the present embodiment, enough teaching, suggestion, and implementation illustration for implementation, circuit scheme and disposed relation regarding the biomolecule magnetic sensor 2200 can be obtained from the above embodiments in FIG. 19 to FIG. 20, thus related descriptions thereof are not repeated hereinafter.

Quantities and types of the magnetic sensors and the reference impedors are merely used to describe the embodiments of the disclosure, and the disclosure is not limited thereto.

In summary, in the biomolecule magnetic sensors described in the embodiments of the disclosure, at least one of the first magnetic field lines generated by the magnetic field line generator is made passing through the magnetic beads, where a second shift is provided between the magnetic sensor and the absorption pad in the second direction. Also, the magnetic sensor is disposed on the at least one of the second magnetic field lines and configured to sense the magnetic field component of the at least one of the second magnetic field lines in the second direction, where the first direction is different from the second direction. Accordingly, influences caused by the magnetic field generated by the magnetic field line generator on the magnetic sensor can be reduced. Moreover, the structure can be simplified to substantially reduce the volume in terms of future device design and usage in order to realize products related to handheld biological-based detector.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A biomolecule magnetic sensor, configured to sense magnetic beads attached with biomolecules, the biomolecule magnetic sensor comprising:

an adsorption pad, configured to adsorb the magnetic beads;

a magnetic field line generator, configured to generate a plurality of first magnetic field lines, at least one of the first magnetic field lines passing through the magnetic beads adsorbed on the adsorption pad along a first direction and making the magnetic beads respond to the at least one of the first magnetic field lines so as to induce a plurality of second magnetic field lines, wherein the magnetic field line generator is disposed between the adsorption pad and at least one magnetic sensor in the first direction, and a first shift and a second shift are provided between the magnetic sensor and the adsorption pad in different directions; and the at least one magnetic sensor, disposed on at least one of the second magnetic field lines, and configured to sense a magnetic field component of the at least one of the second magnetic field lines in a second direction, wherein the first direction is different from the second direction, and the second shift is provided between the magnetic sensor and the adsorption pad in the second direction, wherein when the at least one magnetic sensor senses the magnetic field component of the at least one of the second magnetic field lines, the magnetic beads is adsorbed on the adsorption pad, and wherein the first direction is neither parallel nor anti-parallel to the second direction, the first direction is perpendicular to a surface of the adsorption pad for absorbing the magnetic beads, and the second direction is perpendicular to the first direction.

2. The biomolecule magnetic sensor of claim 1, wherein a third shift is provided between the at least one magnetic sensor and the magnetic field line generator in the second direction, wherein the third shift is equal to or greater than the second shift.

3. The biomolecule magnetic sensor of claim 1, wherein the first shift is provided between the at least one magnetic sensor and the adsorption pad in the first direction.

4. The biomolecule magnetic sensor of claim 1, wherein the magnetic field line generator is a magnetic thin-film layer, configured to spontaneously generate the first magnetic field lines.

5. The biomolecule magnetic sensor of claim 4, wherein a magnetic moment direction of the magnetic thin-film layer is perpendicular to a film surface of the magnetic thin-film layer.

6. The biomolecule magnetic sensor of claim 5, wherein a structure of the magnetic thin-film layer is a single-layer structure or a composite structure, a ferromagnetic material of the single-layer structure comprising Fe, Co, Ni, Gd, Tb, Dy, a FePt alloy, a CoFeB alloy, a CoFe alloy, a NiFe alloy or a FeB alloy, and the composite structure comprising a Fe—Pt composite layer, a Fe—Ni composite layer, a Fe—Pd composite layer, a Co—Pt composite layer, a Co—Ni composite layer or a Co—Pd composite layer.

7. The biomolecule magnetic sensor of claim 1, wherein the magnetic field line generator comprises at least one conductive line.

8. The biomolecule magnetic sensor of claim 7, wherein the at least one conductive line comprises two straight conductive lines arranged in parallel to each other, and currents received by the straight conductive lines are in opposite directions.

9. The biomolecule magnetic sensor of claim 1, wherein the adsorption pad is disposed between the magnetic beads and the magnetic field line generator.

10. The biomolecule magnetic sensor of claim 1, wherein the at least one of the first magnetic field lines passes through the adsorption pad along the first direction.

11. The biomolecule magnetic sensor of claim 1, wherein a shape of the adsorption pad is a rectangle or a circle.

12. The biomolecule magnetic sensor of claim 1, wherein the at least one of the second magnetic field lines shows an annular distribution near the adsorption pad, dividing two ends of the at least one of the second magnetic field lines into a top portion and a bottom portion opposite to each other, wherein the at least one magnetic sensor is disposed on the bottom portion of the at least one of the second magnetic field lines.

13. The biomolecule magnetic sensor of claim 12, wherein the at least one magnetic sensor is symmetrically distributed in accordance with the adsorption pad.

14. The biomolecule magnetic sensor of claim 13, wherein the at least one magnetic sensor surrounds a central axis of the adsorption pad.

15. The biomolecule magnetic sensor of claim 1, further comprising:
a first magnetic sensing circuit, comprising the magnetic sensor and a reference impedor, the magnetic sensor and the reference impedor being coupled to a first output terminal for outputting a first sensing output signal, the first sensing output signal corresponding to a ratio of impedances corresponding to the reference impedor and the magnetic sensor; and
a first output circuit, coupled to the first output terminal and outputting a first sensing signal according to the first sensing output signal.

16. The biomolecule magnetic sensor of claim 15, further comprising:
a second magnetic sensing circuit, comprising a reference magnetic sensor and another reference impedor, another magnetic field line generator being disposed next to the reference magnetic sensor, no magnetic bead being provided on the another magnetic field line generator, the reference magnetic sensor and the another reference impedor being coupled to a second output terminal for outputting a second sensing output signal, the second sensing output signal corresponding to a ratio of impedances corresponding to the another reference impedor and the reference magnetic sensor after sensing at least one of magnetic field lines generated by the another magnetic field line generator;
a second output circuit, coupled to the second output terminal and outputting a second sensing signal according to the second sensing output signal; and
an analog-to-digital conversion circuit, coupled to the first output circuit and the second output circuit, and configured to receive the first sensing signal and the second sensing signal being analog signals and convert the first sensing signal and the second sensing signal into a digital sensing signal.

17. The biomolecule magnetic sensor of claim 15, further comprising:
another first magnetic sensing circuit, having another first output terminal for outputting another first sensing output signal;
another first output circuit, coupled to the another first output terminal and outputting another first sensing signal according to the another first sensing output signal; and
an analog-to-digital conversion circuit, coupled to the first output circuit and the another first output circuit, and configured to receive the first sensing signal and the another first sensing signal being analog signals and convert the first sensing signal and the another first sensing signal into a digital sensing signal.

18. The biomolecule magnetic sensor of claim 1, further comprising:
a third magnetic sensing circuit, comprising at least one magnetic sensor set, each of the at least one magnetic sensor set comprising two said magnetic sensors, and the magnetic field components of the at least one of the second magnetic field lines in the second direction sensed by the magnetic sensors are in opposite directions, wherein the at least one magnetic sensor set is coupled to a third output terminal for outputting a third sensing output signal, and the third sensing output signal corresponds to a ratio of impedances respectively corresponding to the magnetic sensors; and
a third output circuit, coupled to the third output terminal and outputting a third sensing signal according to the third sensing output signal.

19. The biomolecule magnetic sensor of claim 18, further comprising:
a fourth magnetic sensing circuit, comprising at least one reference magnetic sensor set, each of the at least one reference magnetic sensor set comprises two said reference magnetic sensors, another magnetic field line generator being disposed next to the reference magnetic sensors, no magnetic bead being provided on the another magnetic field line generator, the magnetic field components of at least one of magnetic field lines generated by the another magnetic field line generator in the second direction sensed by the reference magnetic sensors are in opposite directions, wherein the at least one reference magnetic sensor set is coupled to a fourth output terminal for outputting a fourth sensing output signal, and the fourth sensing output signal corresponding to a ratio of impedances corresponding to the reference magnetic sensors after sensing the at least one of the magnetic field lines generated by the another magnetic field line generator;

a fourth output circuit, coupled to the fourth output terminal and outputting a fourth sensing signal according to the fourth sensing output signal; and an analog-to-digital conversion circuit, coupled to the third output circuit and the fourth output circuit, and configured to receive the third sensing signal and the fourth sensing signal being analog signals and convert the third sensing signal and the fourth sensing signal into a digital sensing signal.

20. The biomolecule magnetic sensor of claim 18, further comprising:

another third magnetic sensing circuit, having another third output terminal for outputting another third sensing output signal;

another third output circuit, coupled to the another third output terminal and outputting another third sensing signal according to the another third sensing output signal; and an analog-to-digital conversion circuit, coupled to the third output circuit and the another third output circuit, and configured to receive the third sensing signal and the another third sensing signal being analog signals and convert the third sensing signal and the another third sensing signal into a digital sensing signal.

* * * * *